United States Patent [19]
Matsushita

[11] Patent Number: 5,502,321
[45] Date of Patent: Mar. 26, 1996

[54] FLASH MEMORY HAVING INCLINED CHANNEL

[75] Inventor: Tadashi Matsushita, Nara, Japan

[73] Assignee: Sharp Kabushiki Kaisha, Japan

[21] Appl. No.: 327,910

[22] Filed: Oct. 24, 1994

[30] Foreign Application Priority Data

Nov. 8, 1993 [JP] Japan .................................. 5-278209

[51] Int. Cl.⁶ .............................................. H01L 29/788
[52] U.S. Cl. ........................ 257/316; 257/317; 257/321
[58] Field of Search .................................. 257/315, 316, 257/321, 322, 317; 365/185

[56] References Cited

U.S. PATENT DOCUMENTS

| | | | |
|---|---|---|---|
| 4,222,062 | 9/1980 | Trotter et al. | 257/316 |
| 4,622,737 | 11/1986 | Ravaglia | 257/321 |
| 4,796,228 | 1/1989 | Baglee | 257/321 |
| 4,812,885 | 3/1989 | Riemenschneider | 257/316 |
| 4,963,825 | 10/1990 | Mielke | 324/158 |
| 4,964,080 | 10/1990 | Tzeng | 365/185 |
| 4,990,979 | 2/1991 | Otto | 257/321 |
| 5,049,515 | 9/1991 | Tzeng | 437/43 |
| 5,341,342 | 8/1994 | Brahmbhatt | 257/315 |

FOREIGN PATENT DOCUMENTS

| | | | |
|---|---|---|---|
| 57-111067 | 7/1982 | Japan | 257/315 |
| 61-127179 | 6/1986 | Japan . | |

*Primary Examiner*—Robert P. Limanek
*Attorney, Agent, or Firm*—Nixon & Vanderhye

[57] ABSTRACT

A electrically erasable and programmable memory comprising: a semiconductor substrate; a source region and a drain region formed spaced apart from each other by a definite distance on a main surface of said semiconductor substrate; a channel region provided between the source region and the drain region; a gate insulating film provided on the channel region; a floating gate electrode provided on the gate insulating film; and a control gate electrode provided with an interlayer insulating film sandwiched therebetween so that the control gate electrode at least partially laminates the floating gate electrode; the channel region and the main surface having an inclined portion and the source region being provided relatively above or below the drain region.

17 Claims, 18 Drawing Sheets

(At erasing)

(At writing)

FLASH MEMORY HAVING INCLINED CHANNEL

BACKGROUND OF THE INVENTION

1. Field of the Invention

The present invention relates to a flash memory and a method for manufacturing the same. More particularly, the invention relates to an electrically writable and erasable flash memory having a floating gate electrode, and a method for manufacturing the same.

2. Description of the Related Art

Various flash memories and methods for realizing the same have been proposed, which memories allow data to be electrically written therein and erased therefrom. One of the flash memories noted quite recently uses what is called a hot electron injection. Such flash memory provides a floating gate electrode in a gate insulating film located under a control gate electrode wherein a high voltage is applied to a space between a source and a drain region, and a high voltage is also applied to the control gate electrode so that a hot carrier thus generated is absorbed by an electric field in the control gate electrode and is then injected into the floating gate electrode. For example, U.S. Pat. No. 4,963,825 and Japanese unexamined Patent Application No. SHO 61-127179 disclose flash memories which are most noted as a memory having a typical structure. FIGS. 40 through 42 show such typical structure of the flash memory.

FIGS. 40 through 42 are sectional views showing a structure of a so-called single memory cell of a self-aligned type which has the most simple structure among flash memories. On a practical level, such flash memories take more complicated structure, but for simplicity the flash memory will be detailed with respect to FIGS. 40 through 42. Referring to FIGS. 40 through 42, reference numeral 101 designates a P-type silicon substrate, 102 a second gate insulating film, 103 a first gate insulating film, 104 a first polysilicon layer (floating gate electrode), 105 a third gate insulating film, 106 a second polysilicon layer (control gate electrode), 107 a source region ($N^+$type impurity region), 108 a drain region ($N^+$ type impurity region), 109 a device isolation oxide film (LOCOS).

Such structure is called the self-aligned type because the floating gate electrode 104 and the control gate electrode 106 are formed in such a manner that the floating gate electrode 104 and the control gate electrode 106 are flush at the ends thereof (in self-alignment) in the longitudinal direction of the channel. It is known that the source region 107 assumes a lightly dope diffusion layer (LDD) or a double dope diffusion layer (DDD) structure so that a pressure resistance is improved in the erasing operation. FIG. 41 shows the LDD structure whereas FIG. 42 the DDD structure.

The operation principle and the feature of the memory will be briefly described hereinbelow. Data can be written into the memory cell when a high voltage is applied to the drain region 108 and the control gate electrode 106. The control gate electrode 106 absorbs a carrier generated by an avalanche breakdown in a region joining with the drain region 108 in the channel, and then the floating gate electrode accumulates the carrier thus generated. On the other hand, data is erased from the memory cell by applying a high voltage to the source region with the control gate 106 being grounded, and discharging by the Fowler-Nordheim (F-N) tunnel injection an electric load accumulated in the floating gate 104. This operation discharges an electric load through the first gate insulating film 103 thinner than the second gate insulating film 102, which is very likely to cause the F-N tunneling injection. Besides, increasing the thickness of the second gate insulating film prevents erroneous data erasure caused by the read disturb mode from the drain side during data reading.

A method for manufacturing the above described flash memories will be explained hereinbelow. At the outset, a buffer oxide film is grown to a thickness of 3000 Å on the P-type silicon substrate 101. Then on the buffer oxide film a 3000 Å thick silicon nitride film is deposited which constitutes an antioxidant film. On the silicon nitride film, a resist pattern is formed which is open to a region where a device isolation oxide film is formed to isolate a device region into an island-like configuration. The selective removal of the silicon nitride film with this pattern as a mask results in the formation of a silicon nitride film pattern which is open at a portion where the device isolation oxide film is formed. Then, after the resist pattern is removed by etching, boron ions are implanted with the silicon nitride film pattern as a mask (an injection energy; 40 KeV: a dose amount; $5\times10^{13}$ions/cm$^2$) thereby forming a field dope layer. Thereafter, a silicon oxide film is grown on an exposed surface of the P-type silicon substrate to form a device isolation oxide film 109. At this step, activation and redistribution of boron atoms in the field dope layer leads to the formation of a reverse prevention layer on the lower layer of the device isolation oxide film 109.

Then, the silicon nitride film pattern is removed with dry etching. The buffer oxide film is further removed with wet etching. This is followed by thermal oxidation by which the second gate insulating film 102 is grown to a thickness of 20 nm on the exposed surface of the P-type silicon substrate. Then the resist is coated on the entire surface of the substrate so that the resist pattern is formed with the photoetching method, the pattern being open in a region which provide a gate insulating film on the side of the source region. Part of the second gate insulating film 103 is removed with hydrofluoric acid with the resist pattern as a mask. After the resist pattern is removed, the second gate insulating film 103 is formed with thermal oxidation. At this step, the second gate insulating film 102 is additionally oxidized. Hence, the second gate insulating film having a rather thick thickness is formed.

The thickness of the first gate insulating film 103 is controlled to a thickness on the order of 10 nm in the same manner as the gate insulating film of a normal flash memory. The thickness of the second gate insulating film 102 is set to 25 to 35 nm. Then, polysilicon film is grown to a thickness of 1500 Å. on the entire surface of the substrate by chemical vapor deposition (CVD). After N-type impurities such as phosphorus or the like are introduced by thermal oxidation or ion implantation, the polysilicon film is etched with the resist pattern to form a floating gate electrode 104. After the resist pattern is removed, the surface of the floating gate electrode 104 is oxidized to form a 20 to 30 nm thick interlayer insulating film comprising an silicon oxide film. Subsequently, about 2500 Å thick polysilicon film is formed on the entire surface of the substrate by CVD or the like. The polysilicon film is doped with phosphorus just as the floating gate electrode 104. After that, about 1500 Å thick silicon oxide film is formed by, for example, the CVD.

Then the silicon oxide film and polysilicon film are etched with a mask comprising a resist film so that the silicon oxide film and the polysilicon film are consecutively patterned to form a control gate electrode 106. At this time, a portion of a floating gate electrode projecting from the lower portion of the control gate electrode 106 in the lengthwise direction of the channel is etched so that the floating gate electrode 104 and the control gate electrode 106 are formed in self-alignment. Then after the resist is removed, an oxide film is formed on the entire surface thereof, and arsenic (As) ions are implanted at a low energy using the control gate 106 and the floating gate electrode 104 as a mask so that a low concentration diffusion layer (107a and 107b) is formed in a region where a source region is formed. Then after an oxide film is formed by gas phase growth by CVD, a CVD silicon oxide film is etched back by reactive ion etching (RIE) with the result that a side wall is formed on the side of the control gate electrode 106 and the floating gate electrode 104. As ions are implanted at implantation energy of 40 KeV and in the dose amount of $5 \times 10^{15}$ ions/cm$^2$ using the control gate electrode 106, the floating gate electrode 104 and the side wall as a mask and then substrate is annealed so that a source and drain regions (107 and 108) are formed. Thereafter, an interlayer insulating film is formed in accordance with a normal process followed by providing a contact hole and performing a metallization to form a passivation film thereby completing a flash memory having the most basic structure.

In this manner thinning the film on the source side of the gate insulating film below the floating gate electrode facilitates the generation of F-N tunneling in erasing operation. Besides, since the oxide film is thick on the drain side, errors in erasure from the drain side in reading out and writing data can be prevented.

Thus, the flash memory exchanges very frequently electric loads through an extremely thin oxide film located between the channel region, the low concentration diffusion layer and the floating gate electrode. An efficiency at which carriers are exchanged largely affects the heightening of the speed at which the device can operate. In addition, it is not too much to say that the endurance and the reliability of the flash memory depends on how such thin film can be formed. However, the aforementioned conventional structure of the flash memory and conventional method for manufacturing the flash memory have the following drawbacks.

In other words, in accordance with the conventional structure of the flash memory, since the oxide film located between the channel region and the floating gate electrode and electric load associated with the ion implantation proceeds in an almost completely horizontal direction, there arises a problem that a F-N tunneling difficult to achieve.

Besides, in the manufacturing process, a process for forming a thin oxide film below the floating gate electrode comprises a plurality of steps such as:
(1) forming a first gate insulating film,
(2) coating a resist,
(3) exposing and patterning the resist,
(4) edging part of the first gate insulating film by using a resist pattern as a mask,
(5) peeling off the resist, and
(6) forming a second gate insulating film.

It has been extremely difficult to form highly accurate and thin oxide thin film with good reproducibility. In addition, there exists a step at which the gate insulating film closely contacts an organic resist. Thus, it was extremely difficult to prevent contamination of the gate insulating film. Additionally, the oxide film is additionally oxidized after the removal of part of the first gate insulating film so that an edge stress is likely to be generated on a silicon interface in the boundary region of the first gate insulating film and the second gate insulating film. Then, it was extremely difficult to secure a certain level of yield owing to the insulating breakdown of the oxide film before the endurance and reliability of the oxide film can attract the attention of manufacturers.

Furthermore, U.S. Pat. No. 4,964,080 and U.S. Pat. No. 5,049,515 describe flash memories having a select gate structure in which a select gate electrode is formed so that the control gate electrode closely contacts a channel region (vertical region) via an insulating film. However, these flash memories have a drawback of finding a difficulty of high integration compared with a flash memory in which the control gate electrode and the floating gate electrode are formed in self-alignment.

SUMMARY OF THE INVENTION

Therefore, the present invention provides an electrically erasable and programmable memory comprising:

a semiconductor substrate;

a source region and a drain region formed spaced apart from each other by a definite distance on a main surface of said semiconductor substrate;

a channel region provided between the source region and the drain region;

a gate insulating film provided on the channel region;

a floating gate electrode provided on the gate insulating film; and a control gate electrode provided with an interlayer insulating film sandwiched therebetween so that the control gate electrode at least partially laminates the floating gate electrode;

the channel region and the main surface having an inclined portion and the source region being provided relatively on or below the drain region.

Furthermore, the present invention provides a method for forming an electrically erasable and programmable memory comprising the steps of:

forming a thick device isolation oxide film on a predetermined region of a main surface of a first conductive-type semiconductor substrate;

removing an oxide film including part of the device isolation oxide film to form an active region having an inclined portion on the surface thereof;

forming a first gate insulating film on the inclined portion of the active region and a second gate insulating film on the active region except for the inclined portion;

forming a floating gate electrode on the first and the second gate insulating film;

forming a third insulating film on the floating gate electrode;

forming a control gate electrode so that the control gate electrode is patterned in such a manner that the control gate at least partially laminates the floating gate electrode;

patterning the floating gate electrode in self-alignment with the control gate;

implanting second conductive type impurity ions into the control gate electrode thereby forming a source region and a drain region.

BRIEF DESCRIPTION OF THE DRAWINGS

The present invention will be detailed in conjunction with the accompanying drawings, but they are not intended to limit the scope of the present invention.

FIG. 24 (b) is an expanded view of portion A in FIG. 24 (a).

FIG. 24 (c) is a view further expanding the inclined portion of the channel region in the present invention.

DESCRIPTION OF THE PREFERRED EMBODIMENTS

Figure 1:
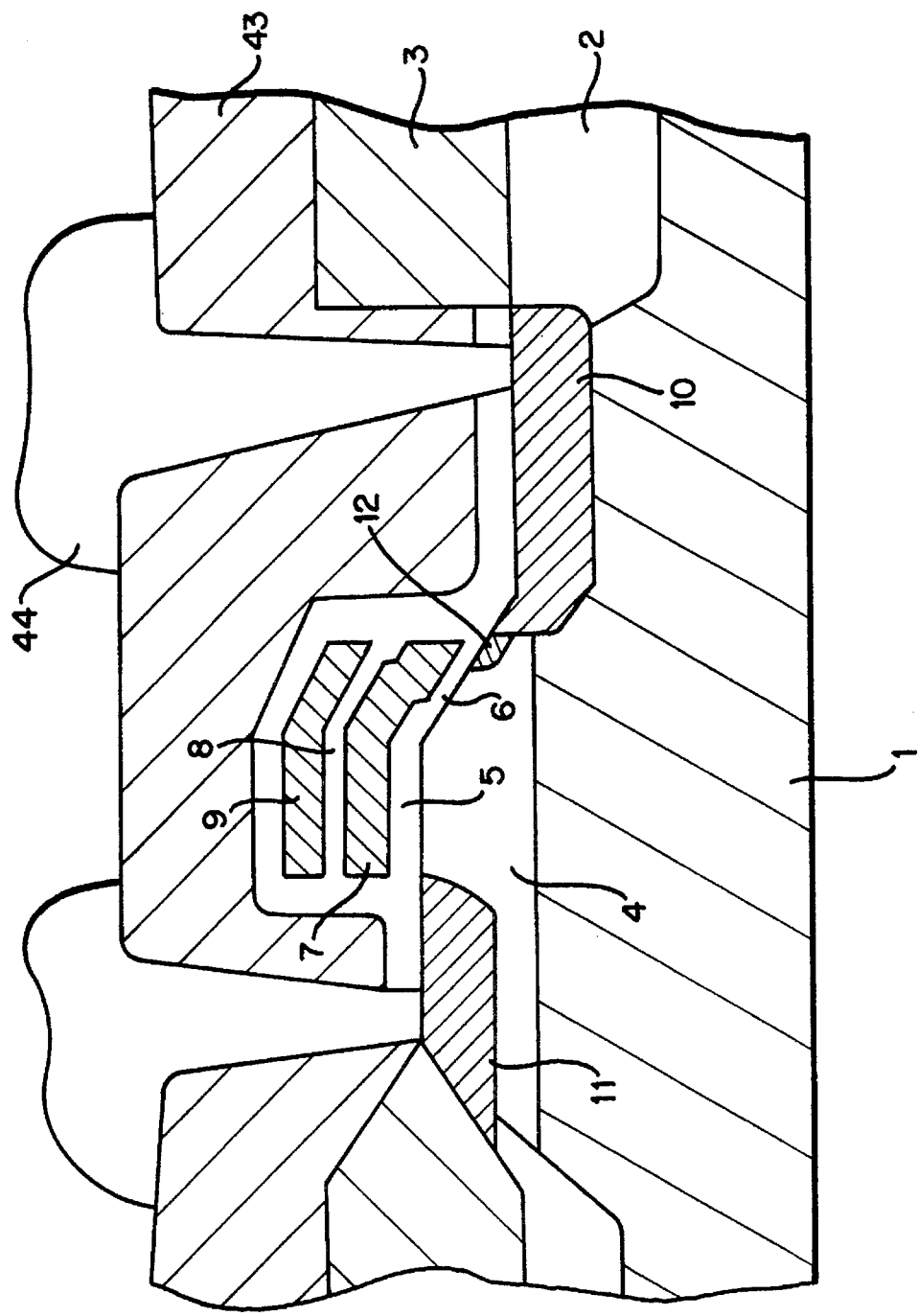
FIG. 1 is a schematic sectional view of a flash memory of the present invention.
Figure 2:
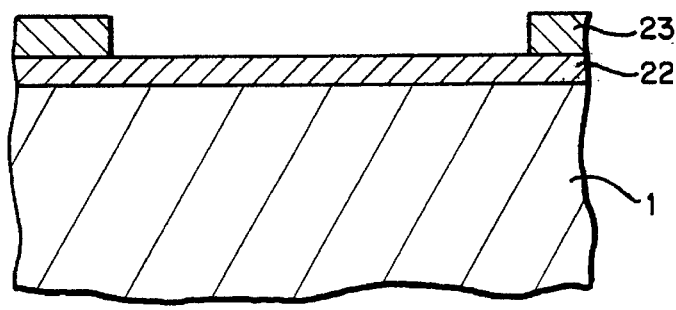
FIG. 2 is a schematic sectional view showing part of a process for manufacturing a flash memory shown in FIG. 1.

Therefore, the inventors of the present invention have found an electrically erasable and programable memory (EEPROM) having a floating gate electrode, which memory can improve the endurance and reliability of the oxide film below the floating gate and improve the performance thereof as well as a method for manufacturing the same, and have made the present invention.

Furthermore, the present invention improves the charge retention characteristic of the floating gate electrode.

With respect to a semiconductor substrate for a flash memory of the present invention, one that can be used in normal flash memories can be used. Such semiconductor substrates include silicon substrate, GaAs substrate and the like. Furthermore, a semiconductor substrate can be used which contains either a p-type or an n-type impurity in advance. Such impurities include boron and the like as p-type impurities and phosphorus and the like as n-type impurities. Furthermore, a substrate is preferably used which is deprived of toxic impurities and defects by gettering. Additionally, an inclined portion is provided on the substrate. Preferably, the inclined portion has a height of 100 to 5000 Å and a width of 200 to 8000 Å. The height can be adjusted so that resolution is not deteriorated in exposure. The height is preferably shorter.

On the surface layer of the substrate a source region and a drain region are provided. The flash memory of the present invention is also characterized by the fact that the position of one of the two regions is considerably higher than the position of the other region. An explanation will be given hereinbelow with respect to a semiconductor in which a source region is located at a position considerably lower than a drain region. However, it goes without saying that the same manufacturing method will be used with respect to a semiconductor device in which a drain region is located at a position considerably lower than the position of the source region.

Furthermore, the semiconductor device provides a channel region between the source region and the drain region. Incidentally, arranging the source region up to the inclined portion allows formation of a device having a short channel. Impurities having a conductive type opposite to the substrate are implanted in the source region and the drain region. Preferably the impurity concentration is $10^{19}$ to $10^{21}$ ions/$cm^3$. Furthermore, a region having a higher impurity concentration than the bulk and the same conductive type can be provided in the neighborhood of the drain region. Providing such region improves the efficiency of hot electron generation thereby raising the writing speed. The channel region can be formed to a sufficient depth which allows the semiconductor device to be free from an influence of profiles that is caused when another impurity region is formed. Preferably such depth assumes Rp 0.1 to 0.4 μm.

Furthermore, on the substrate a floating gate electrode and a control gate electrode are laminated in this order in such a manner that the floating gate electrode and the control gate electrode stretch over the source region and the drain region. Between the substrate and the floating gate electrode, and between the floating gate electrode and the control gate electrode, a gate insulating film is arranged. As a material of each of the electrodes, known materials can be used which include polysilicon and the like. On the entire surface or portion of the floating gate electrode, the impurities concentration or the conductive type thereof can be varied by diffusion or ion implantation. Preferably, the thickness of the floating gate electrode and the control gate electrode is 3000 to 5000 Å. For the formation of an electric field in the vertical direction with respect to the hot electron, or for the increase of charge, the storage capacitance may have a configuration in which the floating gate electrode overlaps the source region.

Furthermore, a known material can be used as a gate insulating film such as, for example, a film comprising silicon oxide, silicon nitride, tantalum or dielectric substance. The gate insulating film may be formed of silicon oxide film-silicon nitride film-silicon oxide film (ONO structure). Here, preferably the gate insulating film between the substrate and the floating gate electrode is thinner on the side of the source region than on the side of the drain region (the thinner gate insulating film on the side of the source region is referred to as a first gate insulating film whereas the thicker gate insulating film on the side of the drain region is referred to as the second gate insulating film). Preferably the thickness of the first gate insulating film and the second gate insulating film ranges between 70 to 100 Å and 100 to 200 Å respectively.

The thickness of a gate oxide film (the oxide film is hereinafter referred to as a third gate insulating film) between the floating gate electrode and the control gate electrode ranges between 150 to 300 Å both inclusive. The third gate insulating film may be thin on the side of the drain region and thick on the side of the source region to improve the lead-in effect. For reducing leakage of electric load, an SiN film may be used in one layer of the insulating film. This can prevent an error in erasure by means of internal photoemission or the like.

A flash memory according to the present invention comprises the above construction. The source region may have an LDD structure, DDD structure or profiled lightly doped drain (PLD) structure. In LDD structure, a low concentration region is further formed on the side of a channel region. Preferably, the impurity concentration in the low concentration region ranges between $10^{17}$ to 10ions/$cm^3$ both inclusive. In DDD structure, the low concentration region is formed so as to cover the source region. Preferably, the impurity concentration in the low concentration region is $10^{18}$ to $10^{19}$ions/$cm^3$. Incidentally, the DDD structure has an advantage that the punch-through is hardly generated compared with the LDD structure. Furthermore, with respect to the PLD structure, an impurity region is formed in such a manner that the region covers the low concentration region of the LDD structure and the source region. Preferably, the impurity concentration in impurity region ranges between $10^{17}$ to $10^{19}$ ions/$cm^3$ both inclusive. These structures serve to improve dielectric strength in erasing operation. In addition, preferably a damaged region formed in ion implantation (in a dose amount of 1 to $9\times10^{14}$ions/$cm^2$) may be diffused so that the region may not overlap another region because of ion implantation for the formation of the low concentration and the high concentration region. For example, a smooth side wall spacer may be extended over a side wall of the antioxidant film so that ions are implanted through the side wall spacer. This prevents the overlapping of the region damaged by the profile formed by ion implantation to the silicon immediately below the edge of the antioxidant film. This side wall spacer can be easily formed by anisotropic etching or using a two-layer film having a different etching rate.

Although the flash memory in the above example takes a two-layer polysilicon structure, the flash memory can take a three-layer polysilicon structure. For example, the flash memory can include an erasing gate.

Furthermore, a device can be isolated with a gate electrode in place of using a device isolation oxide film. Still furthermore, a embedded diffusion layer (bit line or the like) may be provided under the device isolation oxide film.

A method for manufacturing a flash memory according to the present invention will be detailed hereinbelow.

Pretreatment for Forming the Device Isolation Oxide Film

At the outset, on a semiconductor substrate having a predetermined conductive type, a buffer oxide film having a thickness of 1000 Å or more is formed by thermal oxidation. This buffer oxide film is formed for obtaining a length of a bird's beak having a good reproducibility, suppressing the generation of the translocation and slippage in the silicon substrate in this region, and alleviating the stress applied to the antioxidant film to be formed in the subsequent process. On the buffer oxide film, for example, a resist is applied so that a pattern is formed in which only a region for device isolation is open.

Subsequently, for forming a channel dope layer, impurities are implanted into the semiconductor substrate. The impurities to be implanted may be boron or the like as a P-type impurity, and phosphorous or the like as an n-type impurity. The impurity implantation may be conditioned as follows: preferably, the dose amount is $10^{12}$ to $10^{13}$ ions/cm$^2$ and implantation energy 40 to 200 KeV since impurity ions have to be implanted to a sufficient depth so that the substrate might not be affected by the tail of the ion implantation profile. The dose amount and the implantation energy are very important because the hot electron implantation efficiency depends on the concentration. Preferably, the surface concentration is controlled to about 1 to $3 \times 10^{16}$ cm$^3$ when the last step is completed.

The subsequent process is to remove the resist, followed by forming an antioxidant film having a thickness of 700 to 1000 Å by the CVD or the like. Preferably, a silicon nitride film is used as the antioxidant film. This is followed by selectively removing the antioxidant film, by etching using the resist, from the portion where a device isolation region is to be formed.

The resist is removed, and a spin on glass (SOG) film, a TEOS (Si(OC$_2$H$_5$)$_4$) film or the like are coated on the substrate which is followed by forming a side wall spacer on the side wall of the antioxidant film. Then, for forming a field dope layer, impurities are implanted by an implantation energy of 100 to 150 KeV and in a dose amount of $10^{13}$ to $10^{14}$ ions/cm$^2$. Known materials can be used as impurities. In addition, the side wall spacer restricts the implantation of impurities. Thus, the field dope layer can be formed only in a predetermined region.

Process for Forming the Device Isolation Oxide Film

At the subsequent step the device isolation oxide film is formed by thermal oxidation (Local Oxidizations method) at 1000° to 1100° C. The formation of the device isolation oxide film activates and redistributes the above field dope layer to an inversion prevention layer at the lower layer of the device separation oxide film. At the corner edge portion of the device isolation oxide film, a layout is designed so that the main portion of the device might not be located therein.

Pretreatment for Forming an Active Region

At the subsequent step, the antioxidant film is removed by a known method such as dry etching or the like. Impurities are implanted to the substrate at implantation energy of 10 to 20 KeV and at the dose amount of $10^{15}$ to $10^{16}$ ions/cm$^2$. The ion implantation allows impurities to be implanted to a surface buffer oxide film of the substrate except for the region below the device isolation oxide film having a thick thickness. Besides, preferably, impurities that can be used may be such that can be easily taken into a first and a second gate insulating film when such first and second gate insulating films are formed in the later process. Boron is preferable. Furthermore, the substrate is annealed so that an active region is formed. The annealing is conditioned by a temperature at which impurities can freely activate the buffer oxide film. The temperature is such that it exceeds the interface level of a single crystal silicon while it does not exceed the interface level of silicon. This is because the silicon region required a volume of 0.43 to 0.44 (Si/SiO$_2$) for forming a unit volume of the first gate insulating film. Temperatures of 800° to 900° C. is used for the purpose.

Step of Forming An Active Region

At the subsequent step, only the active region and a region where a source region is to be formed are opened by using a resist or the like. The resist is used as a mask to remove the buffer oxide film and the device isolation region in the opening. A known method can be used for removing the device isolation region, but the use of an etchant that affects a silicon interface is not preferable. Nor dry etching is preferable. As a preferable etching method, for example wet etching using HF can be used.

In this manner, the inclined portion formed by oxidation assumes a smooth configuration as compared with the inclination formed by etching. As a consequence, the stepped portion can be more favorably coated, which allows reducing stress on a floating gate electrode or the like which will be formed in the subsequent step, thereby improving the reliability of a device that will be miniaturized. Additionally, the oxidation has an advantage that it causes smaller damage to the silicon interface than etching thereby allowing manufacturing a stable device. In addition, the length of the bird's beak that affects the size of the inclined portion can be easily controlled by controlling the thickness of the buffer oxide film. Then, the minute measurement of the buffer oxide film can be easily adjusted.

Step of Forming the First and the Second Gate Insulating Film

At the subsequent step, a resist or the like is removed to form the first and the second gate insulating film. When the oxide film is used as the insulating film, the insulating film can be formed by thermal oxidation. The method for oxidation can be determined in consideration of the kind of device and the alignment between processes. The method for oxidation include, for example, oxidation using dry O$_2$, pyrogeneratic oxidation and the like. The oxidation temperature may be relatively low ranging between 850° and 950° C. Preferably, the oxidation is performed at about 900° C. (in the oxidation at 900° C., since boron impurities are diffused, the resulting device has an inner channel structure). That is because the oxide film formed by using the dry O$_2$ (the pyrogeneratic oxidation may be used to reduce the trap level) has many advantages such as the largest activated energy which allows easy control of the oxide film, excellent dielectric strength properties, no shift in the threshold value and no increase in the trap density in the oxide film. Such oxidation oxidizes exposed substrate with the result that the thickness of the oxide film of the inclined portion at a portion where the device isolation oxide film is removed becomes thinner than the thickness of the oxide film at the portion of the buffer oxide film. Here, the insulating film at the inclined portion serves as the first gate insulating film whereas the insulating film at the buffer oxide film portion serves as the second gate insulating film. Additionally, the impurities implanted in at the aforementioned step diffuse inside of the insulating film so that the first and the second gate insulating film contribute toward improving the properties as a tunnel insulating film with respect to the electric field, thereby exhibiting an advantage of enhancing endurance with respect to the repetitive rewriting operation.

Otherwise, an inactive substance which can further thermal oxidation, such as argon or the like, can be preliminarily implanted to a region where the second gate insulating film is formed either with or in combination with the aforementioned impurity implantation. Still otherwise, Si ions may be implanted to a region where the second gate insulating film is formed so that the bonding force of Si crystal can be weakened. Such Si ion implantation is advantageous in suppressing diffusion of impurities into the substrate in the buffer oxide film. Incidentally, after the formation of the insulating film, the substrate can be subjected to annealing in the atmosphere of $H_2$ for adjusting the impurity concentration in the insulating film. Since the substrate is oxidized at relatively low temperature, a high interface fixing electric load is generated in the insulating film. The high electric load can be reduced by subjecting the substrate to annealing in the inactive atmosphere of $N_2$, Ar or the like. In addition, when the region where the first and the second gate insulating films are formed are subjected to sacrificial oxidation before the formation of the first and the second gate insulating films, more favorable insulating films can be formed.

The tunnel insulating film may use a laminate layer of a HTO film and a thermal oxide film.

Step of Forming A Floating Gate Electrode

At the subsequent step, polysilicon or the like is laminated on the entire surface of the substrate by CVD or the like followed by etching to form a floating gate electrode at a desired position of the substrate.

Step of Forming a Source and Drain Regions

At the subsequent step, a source and a drain region are formed with the floating gate electrode serving as a mask by impurity implantation. Preferably, conditions for impurity implantation can be an implantation energy of 30 to 80 KeV, a dose amount of $10^{15}$ to $10^{16}$ ions/cm². The impurity is also implanted into the floating gate electrode. The dose amount of the impurity depends on the area and the thickness of the insulating film so that the coupling capacity between the floating gate electrode and the periphery thereof assumes an appropriate value. Here, a deeper channel region can be formed by implanting Si ions to the inclined portion of the channel region.

Step of Forming a Third Gate Insulating Film

At the subsequent step, a third gate insulating film is formed by subjecting the floating gate electrode to oxidation or by other methods.

Step of Forming a Control Gate Electrode

A control gate electrode is formed by laminating polysilicon or the like on the entire surface of the third gate insulating film, followed by etching the polysilicon or the like to form a control electrode. Furthermore, the entire surface on the substrate is subjected to oxidation to form an oxide film thereon. The subsequent step is to etch the floating gate electrode and the control gate electrode in self-alignment using the resist.

At the Subsequent Steps

At the subsequent steps, in accordance with the normal process, an interlayer insulating film is laminated, a contact hole is opened, and a passivation film is formed by metallization which allows forming a flash memory having a self-alignment structure.

When LDD Structure is Formed

An LDD structure can be formed by impurity implantation after the floating gate electrode and the control gate electrode are etched in self-alignment. Preferably, the implantation conditions can be an implantation energy of 40 to 80 KeV and a dose amount of $10^{14}$ to $10^{16}$ ions/cm².

When DDD Structure is Formed

A DDD structure can be formed by ion implantation of a high concentration of $^{75}As^+$ after ion implantation of a low concentration of $^{31}P^+$. Preferably, the implantation condition of $^{75}As^+$ is an implantation energy of 30 to 80 KeV and a dose amount of $10^{14}$ to $10^{16}$ ions/cm².

When PLD Structure is Formed

A PLD structure can be formed by gradually changing an implantation angle and an implantation energy. The implantation conditions can be an implantation energy of 20 to 100 KeV, an implantation angle of 30° to 70° and a dose amount of $10^{13}$ to $10^{16}$ ions/cm². Besides, the implantation conditions may preferably be divided so that a peak concentration of the ion implantation profile assumes about $10^{19}$ to $10^{21}$ ions/cm². Besides, what is important here is to set a sufficient cool-off period between implantations. For example, As ions may be implanted at an implantation energy of 80 KeV and a dose amount of $2\times10^{15}$ ions/cm², an implantation energy of 40 KeV and an dose amount of $1.5\times10^{15}$ ions/cm² and an implantation energy of 20 KeV and a dose amount of $7\times10^{14}$ ions/cm².

Incidentally, in the above description of the method for forming a flash memory according to the present invention, a process has been proposed in which the gate insulating film depends on the dose amount of the substrate. However, the method in accordance with the present invention is not so limited. It goes without saying that the flash memory of the present invention can be manufactured in the method identical to the conventional method. When the conventional method is used for manufacturing the flash memory of the present invention, further cleaning and automation processes as well as extremely severe process control will be necessary. Additionally, since the present invention does not use an offset gate, a bulk may be used in which a channel dope layer is formed to form with good accuracy an erasing gate insulating film.

Figure 37:
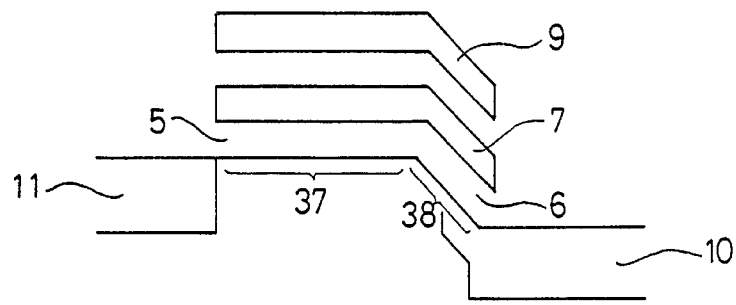
FIG. 37 is a view for illustrating an electric connection of the flash memory of the present invention.
Figure 38:
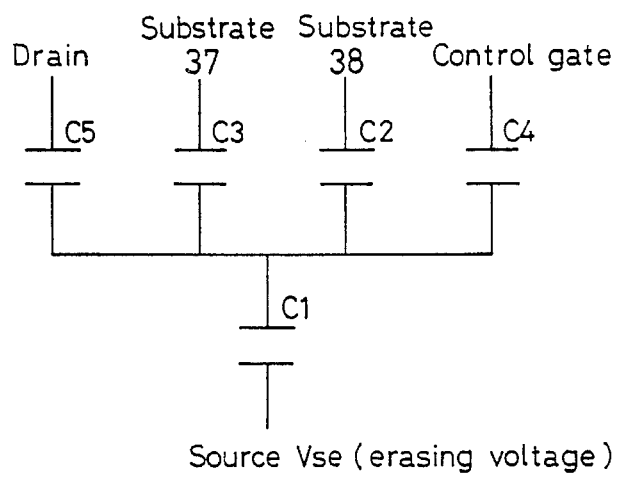
FIG. 38 is a view for illustrating an electric connection of the flash memory of the present invention.
Figure 39:
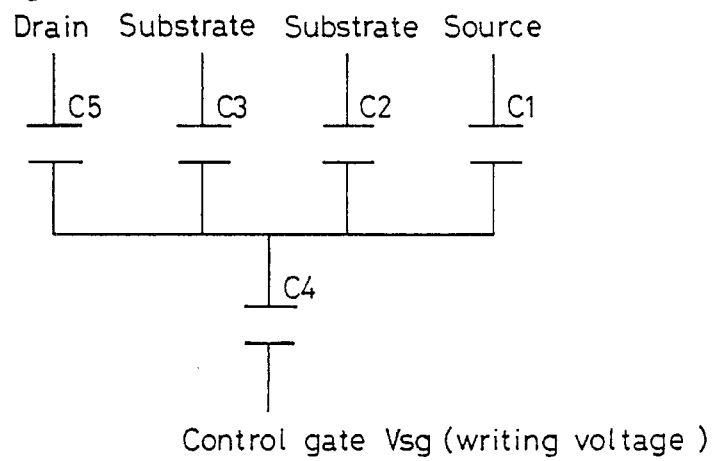
FIG. 39 is a view for illustrating an electric connection of the flash memory of the present invention.
Figure 40:
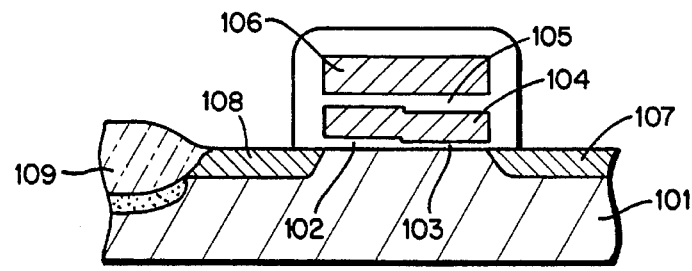
FIG. 40 is a schematic sectional view of a conventional flash memory
Figure 41:
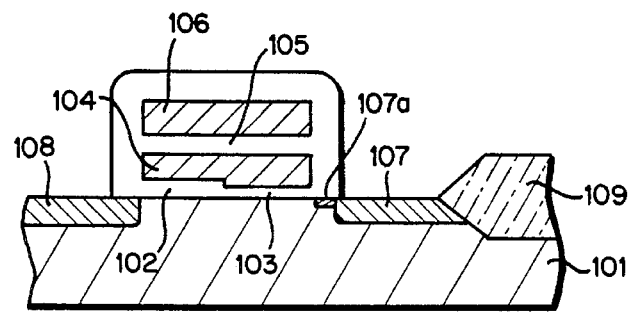
FIG. 41 is a schematic sectional view of a conventional flash memory.
Figure 42:
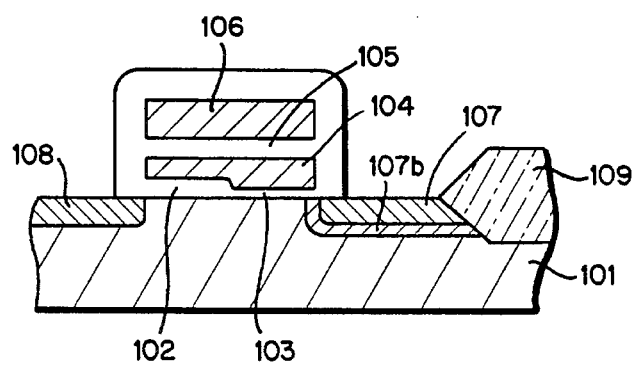
FIG. 42 is a schematic sectional view of a conventional flash memory.

Referring to FIGS. 37 and 39, an electric connection of the flash memory according to the present invention will be explained hereinbelow.

Here symbol Vse designates a erasing voltage applied to the source region 10, Vfg an electric potential at the floating gate electrode 7, C4 a parasitic capacitance between the control gate electrode 9 and the floating gate electrode 7, C3 a capacitance between the floating gate electrode 7 and the substrate 37, C2 a capacitance between the floating gate 7 and the substrate 38 and C1 a capacitance between the floating gate electrode 7 and the drain region 11.

When the thickness of the second gate insulating film is designated by d2, the electric field Ee (erasing) applied to the inside of the second gate insulating film 6 can be briefly represented by the following equation (1):

$$Ee = Vse\ (c5+C4+c3+c2)/d2\ (C1+C2+C3+C4+C5) \quad \text{Equation (1)}$$

Erasing memory by using a tunnel effect requires controlling the appropriate thickness d2. This result in an extreme increase in C1 and reduction in Ee in the absence of the control of an area between the second insulating film 6 and the source region 10. Consequently, the present invention provides a simple method for manufacturing a flash memory, which method allows selecting optimal capacitances described above and securing a definite level of yield ratio to obtain a desired Ee.

On the other hand, when the thickness of the first gate insulating film 5 at the pinch-off point is represented by d1, the writing voltage to the control gate electrode 9 by Vgw, the voltage Vfg of the floating gate electrode 7 that contributes to the drawing of the hot carrier in the first insulating film can be represented by equation (2):

$$Vfg = Vgw\ (C4/(C4+C2+C3+C5+C1)) \quad \text{Equation (2)}$$

Thus, the present invention allows appropriately setting properties of each region for producing C1 to C4, such as an area, a thickness and quality of films and eliminating the non-uniformity in the manufacture of flash memories. Consequently, when memories become finer, writing and erasing properties can be maintained.

On the other hand, since C2 is formed by the substrate 38, the second gate insulating film 6 and the floating gate electrode 7, an effect can be alleviated which is produced as a result of the enlargement of C1 which is resulted from enlarging the capacitance of C2.

EXAMPLE

The present invention will be detailed with respect to examples hereinbelow, but the invention is not so limited. Modifications can be made based on each technological concept described above.

Example 1

A flash memory and a method for manufacturing the same will be explained in conjunction with the drawings when the flash memory is applied to a self-aligned flash memory cell transistor.

FIG. 1 shows a view showing a structure of a cross section of a single cell in a flash memory according to a first example of the present invention. Referring to FIG. 1, reference numeral 1 designates a P-type semiconductor substrate, 2 a field dope layer, 3 a device isolation oxide film (LOCOS), 4 a channel region, 5 a first gate insulating film, 6 a second insulating film provided on the inclined portion and formed from the channel region 4, 7 a first polysilicon layer (floating gate electrode), 8 a third gate insulating film, 9 a second polysilicon layer (control gate electrode), 10 a source region ($N^+$type impurity region), 11 a drain region ($N^+$type impurity region) and 12 an LDD region for improving the dielectric strength in the operation of erasing data in the memory.

The operation principle of the non-volatile memory according to an example of the present invention is the same as the prior art. However, the feature of Example 1 of the flash memory is that the second gate insulating film 6 which discharges an electric load at the time of erasing data in the memory is formed in the inclined portion of the length of the bird's beak (about 0.6–0.8 μm). Besides, the second gate insulating film 6 is characterized by being formed on the channel dope layer region 4 predetermined and controlled with high accuracy in the silicon substrate 1.

In other words, data is written in the flash memory by the application of a high voltage to the drain region 11 and the control gate 9 followed by the absorption of the resulting hot carriers into the control gate 9 and the subsequent accumulation of the hot carriers in the floating gate electrode 7. On the other hand, data is erased by the application of a high voltage to the source region with the control gate electrode 9 grounded, followed by the discharge of the accumulated electric load in the floating gate electrode 7 using the F-N tunnel injection. The electric load is discharged at this time through the thin second gate insulating film 6 formed inside of the inclined portion. Additionally, the source region 10 is formed in a region where are originally device isolated region. Thus, the carrier electric load takes a form of heading from the lower part of the drain region 11 to the Upper part thereof. In this manner, the carrier electric loads progresses with a definite angle relative to the first gate insulating film 5.

Consequently, electric loads tend to jump into the first gate insulating film 5 as compared with a conventional structure in which electric loads travel in a direction approximately horizontal with .respect to the semiconductor surface. This improves the efficiency at which hot carriers are absorbed into the floating gate electrode 7. On the other hand, the structure of the example is so constituted that electric loads can hardly jump into the second gate insulating film 6. Thus securing the dielectric strength of the edge portion in the longitudinal direction of the channel by using the LDD region 12 enables suppressing the generation of the avalanche breakdown on the side of the source region. This alleviates the restrictions imposed on the thickness of the gate insulating films, the erasing voltage and reading voltage thereby realizing a flexible high performance device.

Besides, since the first gate insulating film is formed on the inclined portion of the silicon substrate formed by LOCOS oxidation, a pure insulating film can be formed which contains an extremely small amount of impurities.

On the other hand, the second gate insulating film is formed on the silicon substrate with a surface direction 100, containing a high concentration of impurities such as boron or the like. As a consequence, a large amount of impurities are contained in the second gate insulating film. These impurities serve as hot carriers in the second gate insulating film, largely improving the properties of acquiring the electrons in the neighborhood of the pinch-off point to improve the efficiency at which data is written into the memory.

Because of such properties of the gate insulating film, a flash memory can be obtained which is excellent in writing and erasing properties, electric load holding properties and rewriting endurance.

Furthermore, as compared with the conventional flash memory, a thicker second gate insulating film and a thinner first gate insulating film improve the basic operation of the flash memory that is repeated in which data is written into the floating gate electrode with the electric field of the control gate electrode and data is erased with the electric field of the source electrode. Still furthermore, adjustment of the capacitance coupling of the insulating film with each electrode or source and drain regions allows improvement of the basic operation.

Additionally, since the first gate insulating film is thinner than the second gate electrode in writing operation, the channel below the first gate insulating film is more strongly inverted than a channel below the second gate insulating film. As a result, electrons under the floating gate electrode can move more easily to facilitate the writing operation.

In the foregoing section, a method for manufacturing the above device will be detailed. FIGS. 2 through 13 are sectional views showing a single cell for use in illustrating a method for manufacturing a self-aligned non-volatile flash memory according to the present invention. The amount of the first gate electrode and the source region was appropriately adjusted in accordance with the design rule.

Pretreatment for Forming Device Isolation Oxide Film

At the outset, on a P-type silicon substrate 1 in which the surface oxygen concentration was sufficiently lowered by gettering or the like, a buffer oxide film 22 was grown to a thickness of 1000 Å. To obtain a bird's beak length with an excellent reproducibility, and to alleviate a stress of $10^{10}$ dyn/cm² in a silicon nitride film which was formed later or for the suppression of translocation or the generation of a slop in the silicon substrate, the buffer oxide film was preferably formed to a thickness of 1000 Å or more. In this particular example, 0.8 micron long bird's beak length was formed. Subsequently, on the buffer oxide film 22, a resist pattern 23 was formed which was open only in the device formation region.

Figure 3:
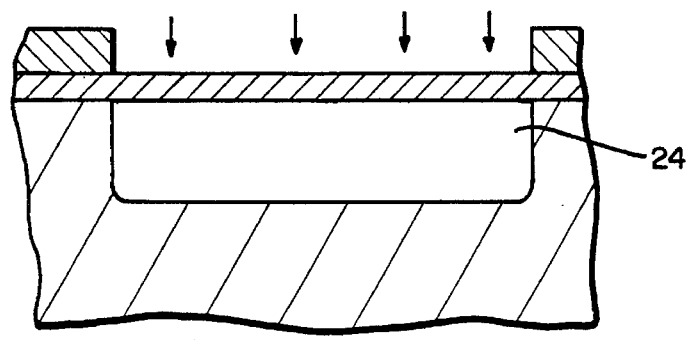
FIG. 3 is a schematic sectional view showing part of the process for manufacturing a flash memory shown in FIG. 1.

In the subsequently process, as shown in FIG. 3, boron was implanted in a dose amount of $5 \times 10^{12}$ ions/cm² and at an implantation energy of 100 KeV to a sufficient depth (Rp 0.3 micron or more) which would not be affected by the tail of the profile formed by the implantation of a high concentration of boron. In this manner, a channel dope layer 24 was formed. Ions has to be implanted with an extremely clean device and in an extremely clean environment. Thus an ion implantation equipment was used which does not sputter heavy ions.

Figure 4:
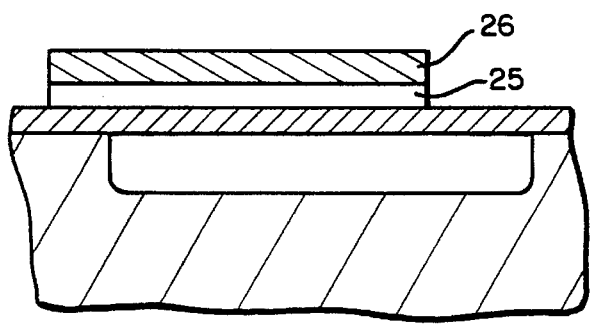
FIG. 4 is a schematic sectional view showing part of the process for manufacturing a flash memory shown in FIG. 1.

As shown in FIG. 4., the resist pattern was removed to deposit to a thickness of 1000 Å a silicon nitride film 25 which constitutes an antioxidant film. Then on the silicon nitride a resist pattern 26 was formed which was only open in a region where a device isolation oxide film was formed for isolating the device region into an island configuration. Selectively removing the silicon nitride film using the resist pattern 26 as a mask allowed the formation of a silicon nitride film pattern 25 which was open at a portion where the device isolation oxide film was formed.

Figure 5:
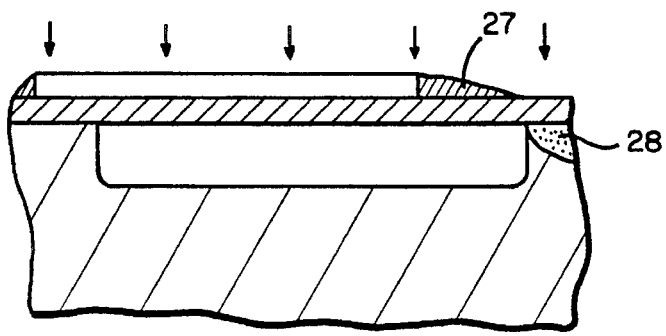
FIG. 5 is a schematic sectional view showing part of the process for manufacturing a flash memory shown in FIG. 1.

Then, as shown in FIG. 5, after the resist pattern 26 was removed by etching, a side wall spacer 27 for restricting the passage of ion implantation was formed on the side wall of the open part of the silicon nitride film pattern 25. Subsequently, boron ions were implanted for the formation of a channel stopper at an implantation energy of 40 KeV and in a dose amount of $5 \times 10^{13}$ ions/cm² to form a field dope layer 28.

Step of Forming Device Isolation Oxide Film

Figure 6:
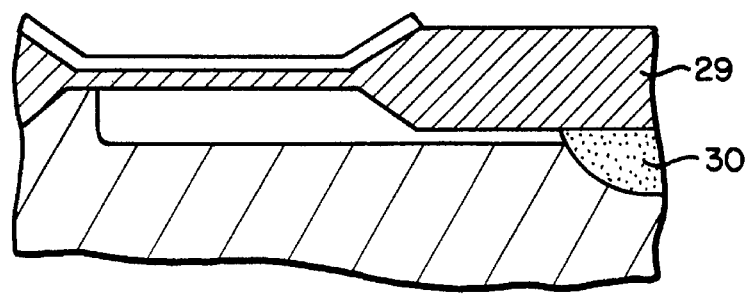
FIG. 6 is a schematic sectional view showing part of the process for manufacturing a flash memory shown in FIG. 1.

Then, as shown in FIG. 6, the substrate was subjected to wet oxidation (so-called local oxidation method) at 1000° C. to grow a silicon oxide film on the exposed surface of the substrate 1, thereby forming a device isolation oxide film 29. In this particular example, the substrate on which the device isolation oxide film was formed to a thickness of about 1 μm is etched by about 4300 to 4400 Å. In the formation process, boron atoms in the field dope layer 28 were activated and redistributed to form an inversion prevention layer 30 on the lower layer of the field channel oxide film 29.

Pretreatment for Forming Activated Region

Figure 7:
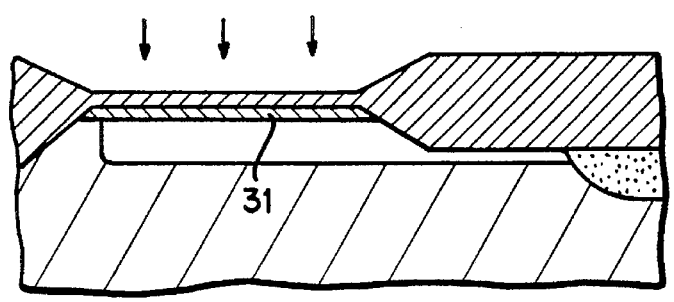
FIG. 7 is a schematic sectional view showing part of the process for manufacturing a flash memory shown in FIG. 1.

Then, as shown in FIG. 7, the silicon nitride film pattern 25 was removed by dry etching. Boron was implanted at an implantation energy of 15 KeV and in a dose amount of $5 \times 10^{15}$ ions/cm² into the buffer oxide film 22. The substrate was subjected to annealing at 850° C. to form a P⁺ type impurity layer 31 on the surface of the device activation region. Boron was implanted in an environment of high degree of cleanliness. The substrate was annealed at the temperature at which boron was freely activated in the buffer oxide film 22 and at the temperature of the activation energy which exceeded the interface level of a single crystal silicon and did not exceed the counterpart of polysilicon. That was because the volume of the silicon region which was required for producing a unit volume of the first gate insulating film was 0.43 to 0.44 Si/SiO₂ with the oxidation method according to the present invention. The P⁺-type impurity layer 31 was extremely similar to the deposited layer.

Furthermore, referring to the P⁺ type impurity layer 31, boron was implanted in a high concentration (with a surface concentration of $3 \times 10^{15}$ ions/cm² or more) into a region in the neighborhood of a transition layer (SiO, SiO₂O, Si₂O₃, SiOx layer) between the silicon substrate and the oxide film and an extremely shallow region having a thickness of about 100 Å or the less on the surface layer on the side of the substrate. The P⁺ type impurity layer 31 was an extremely thin layer whose surface resistance could not be measured by the four probe method. Thus, the conditions required for the formation of the P⁺ type impurity layer 31 could not be theoretically determined, but they could be determined only from experience. However, when the Van Dea Pau method (a classical measurement technique) was adopted as an evaluation method, the conditions could be quite easily determined. In other words, this measurement method comprised forming on a wafer a TEG pattern for the hole measurement, selectively etching an layer to be evaluated with anode oxidation by using an electrolyte such as tetrahydrofurfuryl alcohol and measuring the thickness of the anode oxide film until reaching the silicon substrate to calculate the depth of the P⁺ type impurity layer 31 from the measurement.

In this particular example, the gate insulating film was formed at 900° C., which was the highest temperature in consideration of the inner diffusion constant of the P⁺ type impurity layer 31 in the direction of the substrate. With respect to the generated oxide film properties resulting from the low temperature oxidation, adjusting alignment was required at the subsequent step.

When the oxidation temperature required for the formation of an oxide film having object properties exceeded 900° C., the process might be modified to one in which the silicon bonding force was weakened in an extremely shallow portion of the silicon to be oxidized by implanting a high concentration of silicon to a region where the P⁺ type impurity layer was formed in place of implanting boron to the buffer oxide film 22.

Step of Forming Active Region

Figure 8:
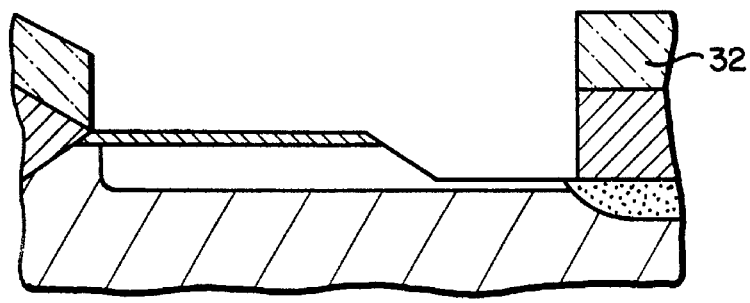
FIG. 8 is a schematic sectional view showing part of the process for manufacturing a flash memory shown in FIG. 1.
Figure 9:
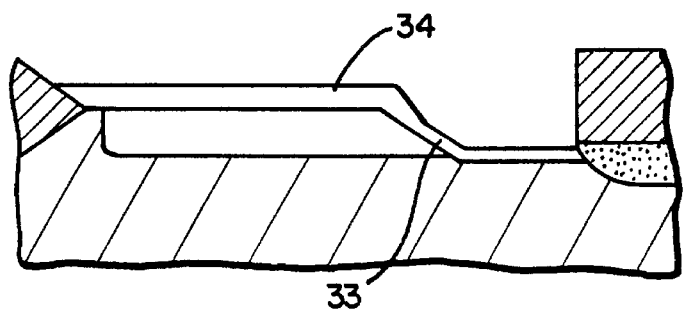
FIG. 9 is a schematic sectional view showing part of the process for manufacturing a flash memory shown in FIG. 1.

Then, as shown in FIG. 8, a resist pattern 32 was formed which was open at a device region where an active region and a source region were to be formed at the subsequent step. Using the pattern 32 as a mask the buffer oxide film 22 and part of the device isolation oxide film was removed by wet etching using a clean HF solution, thereby forming an active region. At this time, since the device isolation oxide film was considerably thicker than the buffer oxide film 22, the buffer oxide film region was overetched and the etching process required about 10 minutes. Part of the surface of the P⁺ type impurity layer 31 was etched.

Step of Forming First and Second Gate Insulating Films

At the subsequent step, the resist pattern 32 was peeled off, thermally oxidized, followed by forming a first and a second gate insulating film (33,34) on the exposed surface of the substrate in the same oxidation process. However, when sacrificial oxidation had been performed in advance to smooth a stepped portion on the substrate surface at the end of the device isolation region, the depth of the P$^+$type impurity layer 31 could be adjusted, and a stable gate insulating film could be provided. Furthermore, the sacrificial oxidation was effective when combined with H$_2$ annealing after oixdation.

The kind of oxidation to be used was determined in view of the kind of device and self-alignment of the process. This example adopted dry O$_2$ oxidation. On the exposed surface other than a region where the device isolation oxide film was formed, the P$^+$type impurity layer 31 was formed. The boron concentration on the surface of the layer was controlled to a concentration exceeding $3\times10^{20}$ions/cm$^2$. On the other hand the surface boron concentration in the bird's beak length region was controlled to a level almost equal to that of the substrate concentration. At the subsequent step, the substrate was oxidized in dry O$_2$ using a vertical type furnace at 900° C. for 15 minutes thereby forming a second gate insulating film 33 having a thickness of about 10 nm in the channel region 24. At this time, since the growth of the oxide film on the P$^+$ type impurity layer 31 depended on the boron concentration on the surface thereof, a first gate insulating film 34 having a thickness of about 15 to 20 nm. The oxidation resulted in the depletion of silicon in the P$^+$ type impurity layer 31 formed on the surface of the substrate. This was because boron had smaller segregation coefficient on the silicon interface compared with phosphorus and arsenic so that boron was incorporated in the thermal oxidation film. On the other hand, since boron had a larger diffusion coefficient in the silicon oxidation film than in silicon, this degree of temperature promotes a little redistribution in silicon, thereby promoting diffusion of boron to the outside. Consequently, the first gate insulating film contained a large amount of boron.

Impurities in these gate insulating film contribute to the improvement of properties of the tunnel oxide film with respect to the electric field unless the amount of impurities exceeds a certain level. The impurities exhibit an effect of enhancing the endurance against repeated rewriting of data in the memory. Adjustment of the boron concentration in the oxide film by annealing in H$_2$ after the formation of the gate insulating film provide still more stable rewriting properties. In addition, oxidation at low temperatures generates a high interface (fixing) electric load in the gate insulating oxide film. However, the high interface electric load can be reduced by annealing in inactive atmosphere (for example, N$_2$, Ar or the like) after the formation of the gate insulating film (see FIG. 9).

Step of Forming a Floating Gate Electrode

Figure 10:
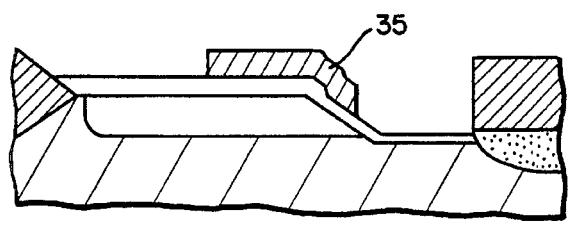
FIG. 10 is a schematic sectional view showing part of the process for manufacturing a flash memory shown in FIG. 1.

Subsequently, as shown in FIG. 10, polysilicon film was grown to 1500 Å on the entire surface by CVD. The polysilicon film was etched by using the resist pattern. After the floating gate electrode 35 was formed, the resist pattern was removed.

Step of Forming a Source and Drain Regions

Figure 11:
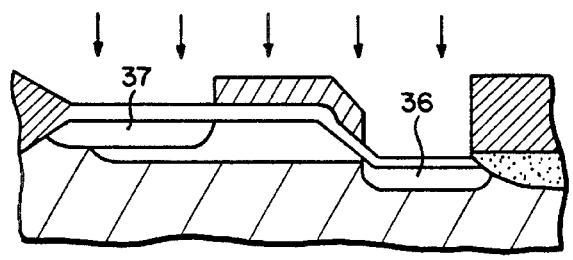
FIG. 11 is a schematic sectional view showing part of the process for manufacturing a flash memory shown in FIG. 1.

Subsequently, as shown in FIG. 11, a source region 36 and a drain region 37 were formed by ion implanting As ions at an implantation energy of 40 KeV and at dose amount of 5× 10$^{15}$ions using the device isolation oxide film and the floating gate as a mask. At this step, the floating gate electrode was doped with n-type impurities. An additional amount of the impurities might be implanted into the source region at higher energy. Otherwise, an additional amount of impurities might be implanted to the drain region which had a higher concentration than the channel region with the same conductive type as the channel region. Still otherwise, As and P ions might be simultaneously implanted.

Step of Forming the Third Gate Insulating Film

The surface of the floating gate electrode 35 was oxidized and the third gate insulating film 38 was formed to a thickness of about 20 to 30 nm. As ions doped the surface of the floating gate electrode in well controlled manner in the same amount as As ions doped the source and drain regions. Thus the third gate insulating film 38 with a favorable uniformity could be provided.

Step of Forming a Control Gate Electrode

Figure 12:
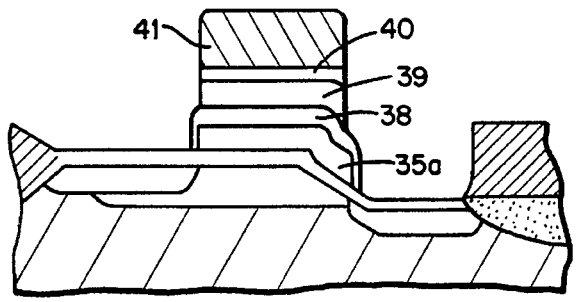
FIG. 12 is a schematic sectional view showing part of the process for manufacturing a flash memory shown in FIG. 1.

Then, as shown in FIG. 12, polysilicon film was formed to a thickness of about 2500 Å on the entire surface of the substrate by CVD or the like for the formation of a control gate electrode. Phosphorus doped the polysilicon film like the floating gate electrode. The control gate electrode might comprise two layers of polysilicon and WSi. Then, for example, an oxide silicon film 40 was formed to a thickness of about 1500 Å by CVD. Then, the oxide silicon film and the polysilicon film were subsequently patterned by etching using a mask 41 comprising a resist film thereby forming a control gate 39. At this time, with respect to the channel length direction, the floating gate electrode 35a extending from the lower part of the control gate electrode to the source region was etched to realize a self-aligned arrangement.

Figure 13:
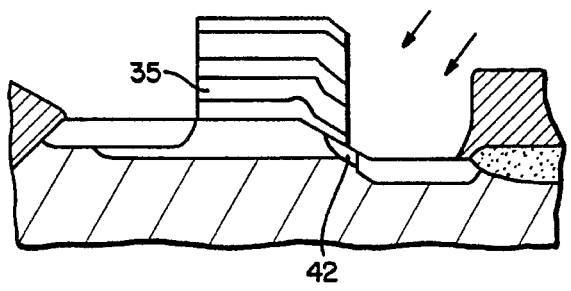
FIG. 13 is a schematic sectional view showing part of the process for manufacturing a flash memory shown in FIG. 1.

After the resist was removed, then As ions were implanted at a low energy and in a low concentration by using the control gate electrode 39 and the floating gate electrode 35 as a mask, so that a low concentration diffusion layer (LDD) 42 was formed in the source and drain formation regions as well as the gate off-set portion (see FIG. 13). The low concentration diffusion layer 42 overlapped the floating gate electrode at an appropriate portion by subsequent heat treatment. As ions might be implanted by rotating the substrate through an angle of about 60° so that the required overlap might be facilitated. The surface concentration of the source region which overlaps the gate electrode preferably assumes $10^{18}$/cm$^3$ or less in the low concentration layer and $10^{19}$/cm$^3$ or more in the high concentration layer when the gate oxide film has a thickness of 60 to 100 Å. This is intended to inhibit an increase in the leak current caused by the Zener phenomenon in the impurity diffusion layer immediately below the gate electrode with respect to the thin gate oxide film of the present invention. Then the subsequent thermal oxidation resulted in the formation of an oxide film having a sufficient dielectric strength at an interface formed by the side wall of the floating gate electrode and the control gate electrode, and the source and drain regions.

At a subsequent step, after an oxide film formed on the surface of the substrate, an interlayer insulating film 43 was formed in accordance with the normal process. A contact hole was opened on the substrate and the substrate was subjected to metallization 44 so that a passivation film (not shown in the drawings) was formed. Thus, a flash memory having a self-aligned structure was completed which used the present invention (see FIG. 1).

In the succeeding passage, three operations such as writing, erasing and reading data will be described which constitute the basic operation of the flash memory.

The writing operation will be explained initially. When a voltage of 5 V was applied to the drain region and a voltage of 12 V was applied to the control gate electrode after the source region was grounded, electrons flowed from the source region to the drain region at a high electric field, and electrons were then generated which could exceed an energy barrier from the silicon surface to the insulating film in the neighborhood of the drain region. In the structure of the present invention, the source region was formed at a region relatively lower than the drain region with the result that the electrons in the high electric field were directed to the insulating film in the neighborhood of the drain region at a predetermined angle. Consequently, the electrons were more easily absorbed into the electric field of the control gate electrode, which improved the writing performance of the flash memory.

The erasing operation was performed in the same manner as the conventional method. Application of an erasing voltage resulted in the discharge of the electric field from the floating gate electrode to the side of the source region. The insulating film in the neighborhood of the source region could be thinned down to about 10 nm, so that the erasing speed could be heightened.

Data could be read from the flash memory by checking the presence of current which flowed from the drain region when a voltage of 5 V was applied to the drain region and the control gate electrode. At this time, the gate insulating film was covered almost completely with a thick gate insulating film. On top of that, the insulating film for erasure which was located in the neighborhood of the source region that had been thinned was formed with an inclination thereby making it difficult for F-N tunneling to be generated. Thus, application of a voltage to the drain region over a long time enabled the prevention of an erred erasure of data.

Since no control gate electrode was formed on the drain region with respect to the a device in which a floating gate electrode extended over the drain region with an insulating film sandwiched therebetween, erred erasure of data caused no problem. However, the insulating film on the drain region had to be formed thicker than the gate insulating film.

Figure 14:
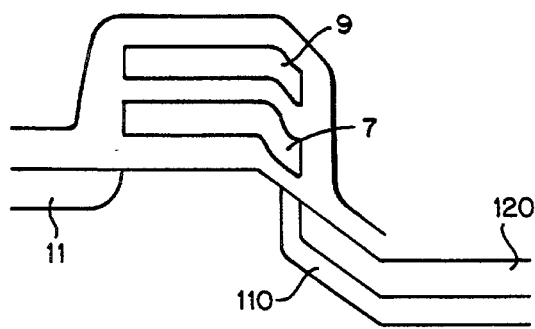
FIG. 14 is a schematic sectional view of a flash memory according to the present invention, the memory having a DDD structure.

The flash memory in the above embodiment assumes an LDD structure, but it can assume a DDD structure. Incidentally, referring to FIG. 14, symbol 110 designates a low concentration impurity area in the source region, and 112 a high concentration impurity area in the source region.

Example 2

Figure 15:
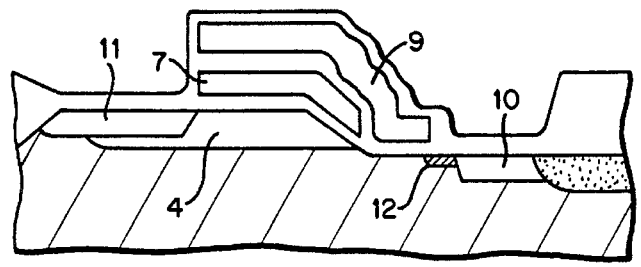
FIG. 15 is a schematic sectional view of an offset type flash memory of the present invention.

FIG. 15 is a view showing an example in which a concept of the present invention is applied to a flash memory of an offset gate type. In the above structure, the insulating film for erasure was provided on an inclined region more steep than the flash memory of self-alignment type. Therefore, the bird's beak length was set to 0.7 micron (the buffer oxide film is set to 500 Å.)

Example 3

Figure 16:
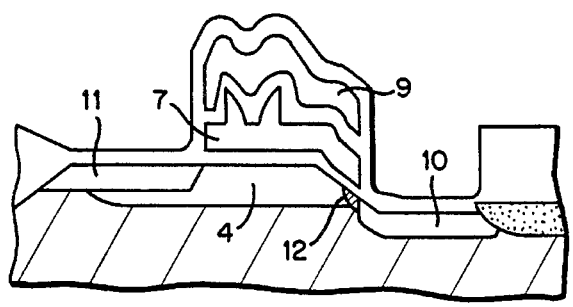
FIG. 16 is a schematic sectional view of the flash memory of the present invention.

FIG. 16 is a view showing the flash memory according to one example of the present invention. An area on the upper part of the floating gate electrode was enlarged to a size larger than an area under the lower part of the floating gate.

The flash memory was manufactured in the same manner as Example 1 except that the flash memory was manufactured according to the following method.

At the outset, a floating gate electrode was formed and then an oxide film was formed thereon. Subsequently, a resist pattern was formed which had an opening on the floating gate electrode of the drain region side. The resist pattern was used as a mask to remove the oxide film at the opening by RIE. After polysilicon was laminated on the entire surface of the substrate, the substrate was etched back by anisotropic etching, thereby removing polysilicon deposited on a portion other than the side wall of the opening of the insulating film. Furthermore, the removal of the oxide film resulted in the formation of a floating gate electrode having a projecting part.

Example 4

Figure 17:
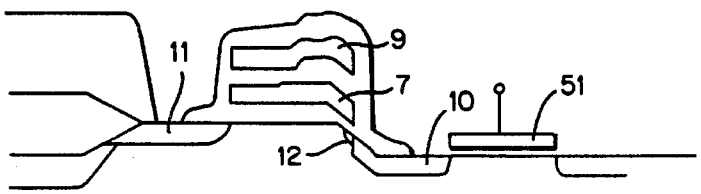
FIG. 17 is a schematic sectional view of the flash memory of the present invention.

FIG. 17 is a view showing one example in which the device isolation by the device isolation oxide film on one side was replaced by the device isolation by the gate electrode 51. A third gate insulating film is formed in such a manner that the insulating film was thin on the side of the drain region and thick on the side of the source region. The flash memory allowed improving the drawing efficiency with the control gate electrode.

Example 5

Figure 18:
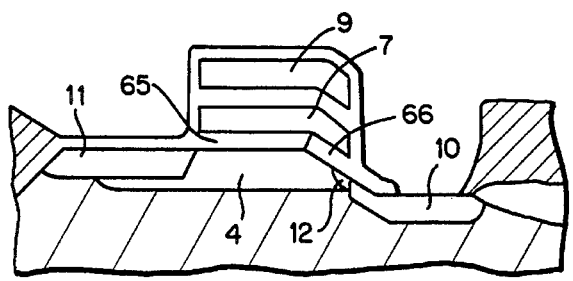
FIG. 18 is a schematic sectional view of the flash memory of the present invention.

FIG. 18 is a view showing one example of the flash memory in which the same advantage was provided by selectively implanting phosphorus impurities and forming an insulating film having a different dielectric rate instead of changing the thickness of the first and the second gate insulating film. In this particular example, the dielectric rate of the first gate insulating film 65 was 3.5 whereas the counterpart of the second gate insulating film 66 was 3.9.

Example 6

In a very fine memory of the present invention, a capacitance coupling between the floating gate electrode and the control gate electrode contributed largely to the selective writing properties. In particular, with respect to a device in which the channel doping is adjusted to a low level and a punch-through is suppressed between the source and drain regions for the improvement of the endurance against the avalanche breakdown, the capacity coupling between the floating gate electrode to which a writing signal is applied and drain region constitutes a very important factor.

Figure 19:
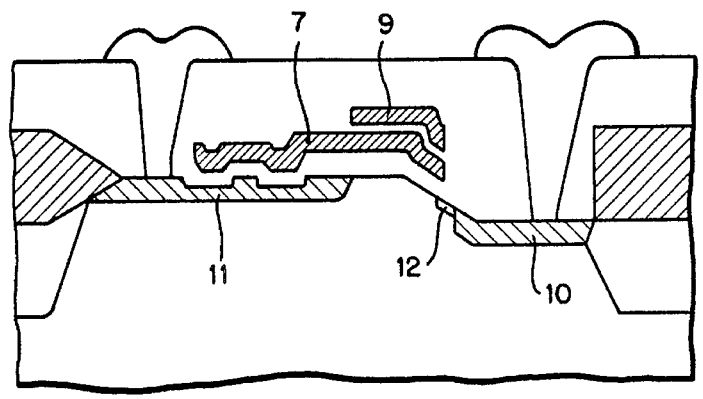
FIG. 19 is schematic sectional view of the flash memory of the preset invention, the flash memory having an increased coupled capacity.
Figure 20:
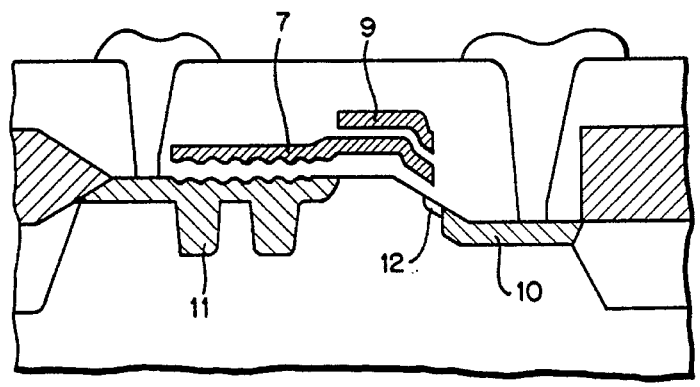
FIG. 20 is schematic sectional view of the flash memory of the present invention, the flash memory having an increased coupled capacity.
Figure 21:
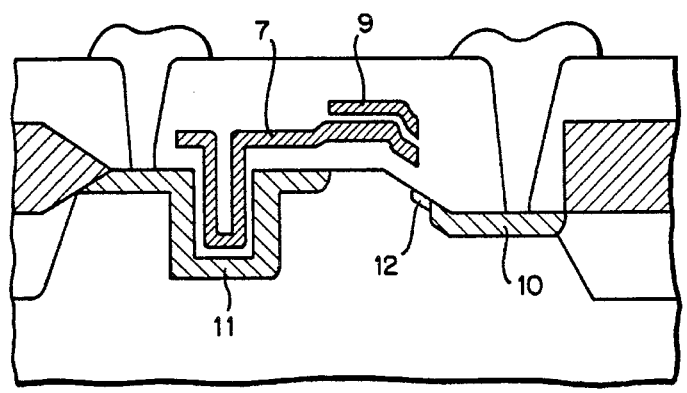
FIG. 21 is schematic sectional view of the flash memory of the present invention, the flash memory having an increased coupled capacity.

Then, FIGS. 19 through 21 shows a device in which the floating gate electrode is extended on the drain region with an insulating film sandwiched therebetween, the drain region is used as a control gate electrode to increase the coupling capacity to improve the writing efficiency. Referring to FIGS. 19 through 21, uneven patterns are provided on the drain region, the coupling depth of the trench region is changed, and a trench is provided in the drain region to increase the capacity coupling. Referring to FIGS. 19 through 21, the same bias is applied to the drain region and the control gate electrode which makes it very difficult to stabilize the pinch-off. As a countermeasure against such a problem, a ferroelectric film is preferably provided on the gate insulating film of the source side, and a high concentration of impurities more preferably dope in the channel region of the drain side.

Example 7

Figure 22:
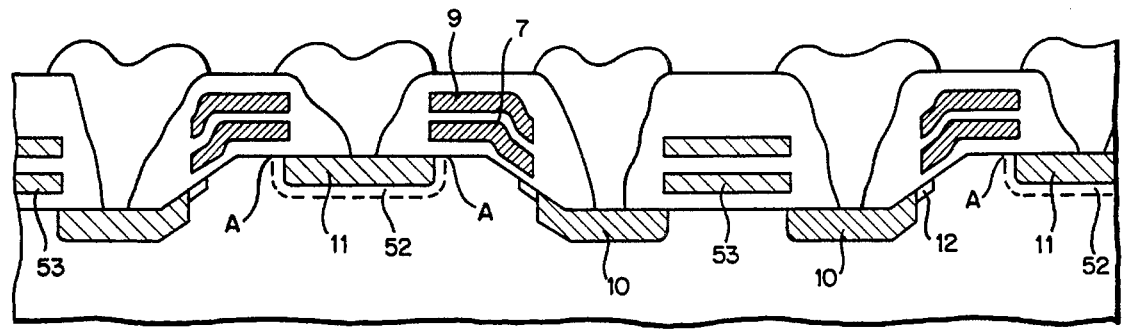
FIG. 22 is a schematic sectional view of a device in which the flash memory of the present invention.

Referring to FIG. 22, the device was isolated with the gate 53. At steps of manufacturing step of this device, after the LOCOS oxide film was removed, the floating gate electrode and the device isolation gate were formed at the same step. The gate was used as a mask to form the source and drain regions. Such structure allowed conduction between source regions adjacent to the device isolation gate 53 to be realized in a flexible manner. Incidentally, the device isolation gate might be realized with the floating gate electrode and the control gate electrode. This enabled setting the degree of device isolation by selecting in advance the floating gate electrode to accumulate electric loads. Moreover, a diffusion layer 52 was formed which had a little higher concentration than the channel region in such a manner that the diffusion layer covered the drain region 11 formed under the floating gate electrode 7. Symbol A designates a pinch-off point in FIG. 22.

Example 8

Figure 23:
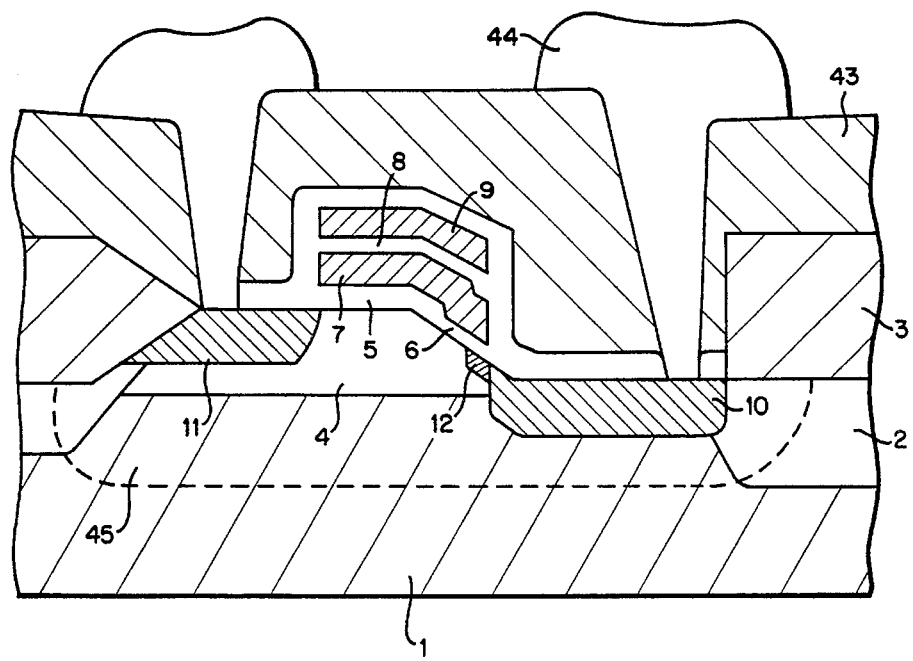
FIG. 23 is a schematic sectional view of a flash memory of the present invention.

Moreover, as shown in FIG. 23, a device shown in FIG. 1 might be formed in a well 45. The conductive type of this well might be of the same as or the reverse of the substrate.

Example 9

Figure 24A:
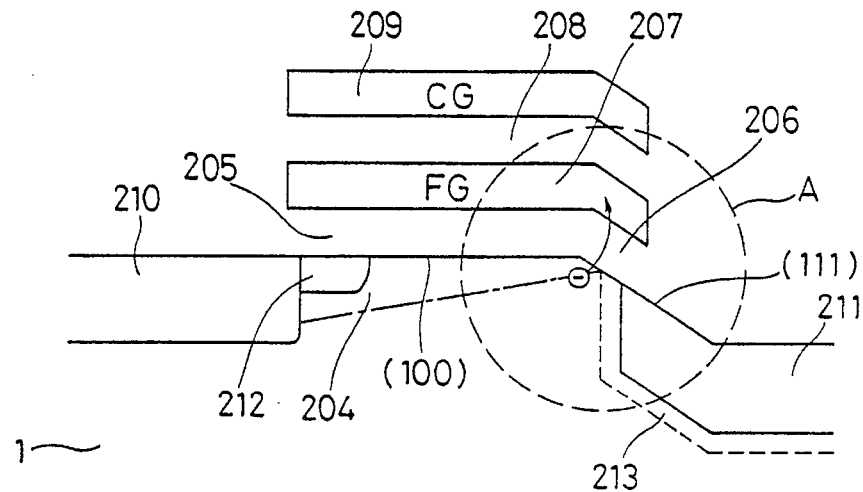
FIG. 24 (a) is a schematic view of the flash memory of the present invention.
Figure 24B:
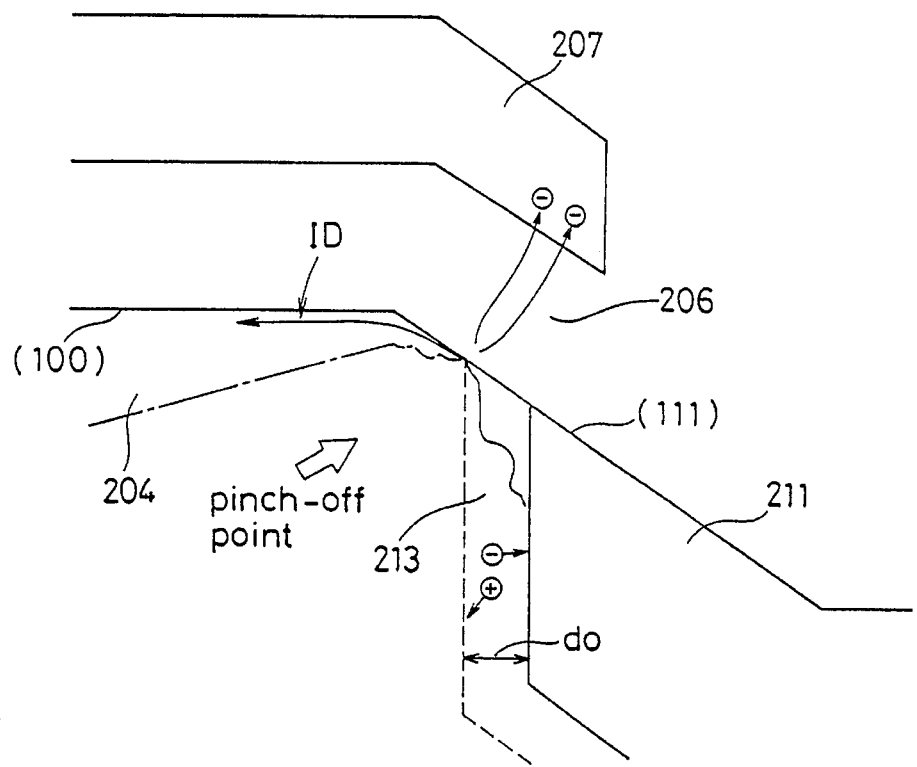
Figure 24C:
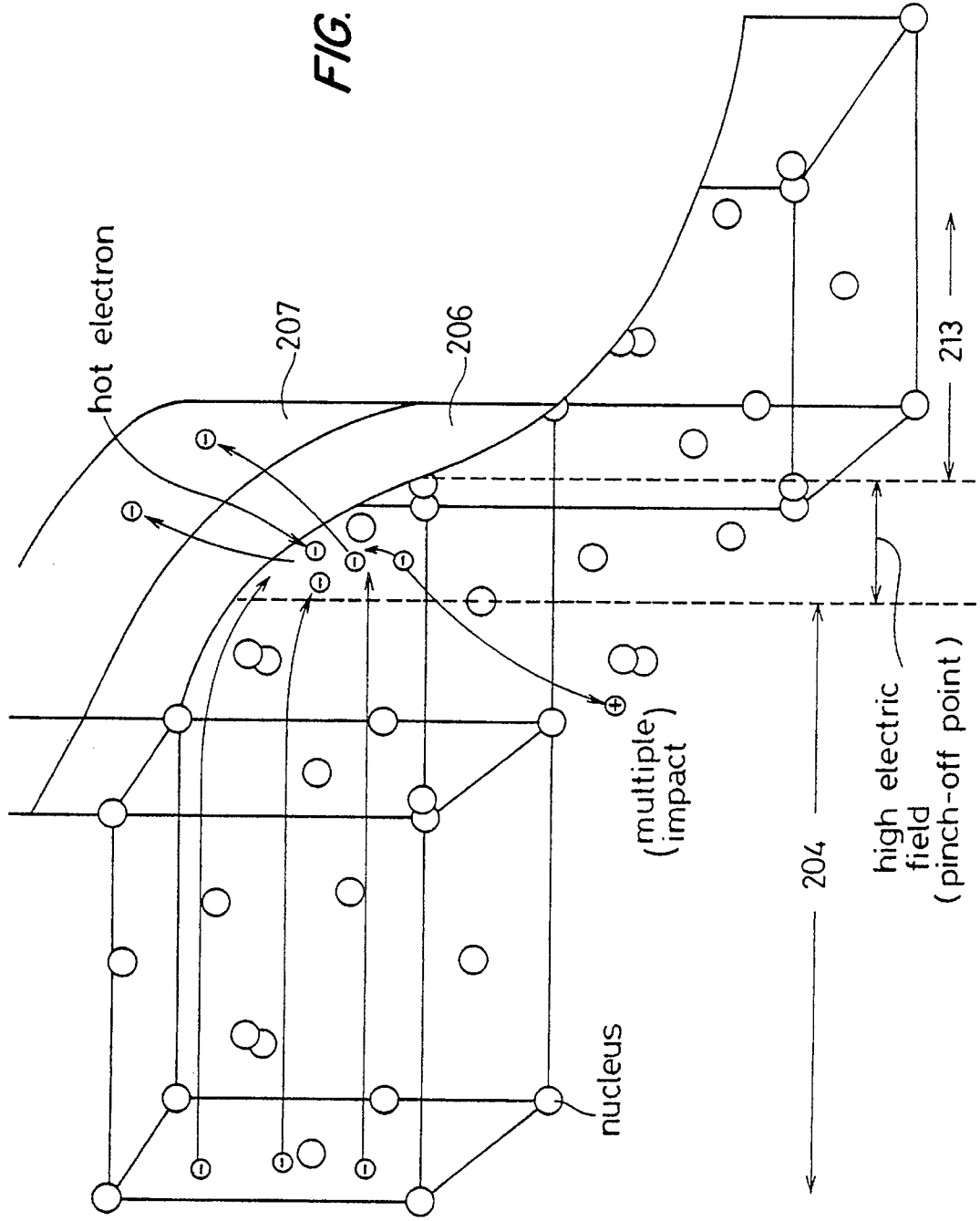

In the above examples, devices were formed in which the drain region was formed above the source region. However, as shown in FIGS. 24 (*a*) to (*c*) a device might be formed in which the source region was formed above the drain region. In the latter case, the substrate surface direction might be used for the channel region on the source side. FIG. 24 (*a*) is a schematic view of a cell, FIG. 24 (*b*) is an expanded view of portion A of the floating gate electrode, and FIG. 24 (*c*) is a view further expanding the inclined portion of the channel region.

Referring to FIGS. 24 (*a*) through 24 (*c*), reference numeral 201 designates a P-type semiconductor substrate, 204 a channel region, 205 a first gate oxide film, 206 a second gate insulating film provided on an inclined portion and formed in the semiconductor substrate, 207 a floating gate electrode, 208 a third gate insulating film, 209 a control gate electrode, 210 a source region, 211 a drain region, 212 a LDD region for improving dielectric strength at the erasing operation.

The device shown in FIG. 24 (*a*) was manufactured in the following manner.

Figure 43:
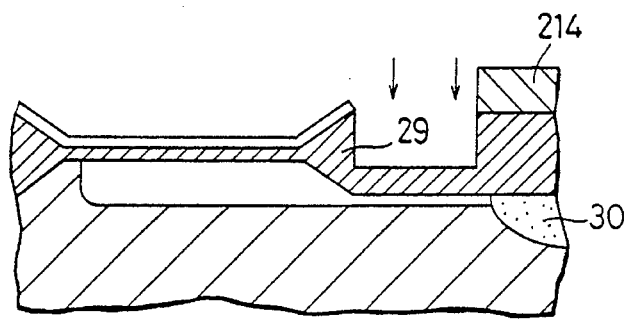
FIG. 43 is a schematic sectional view showing part of a process for manufacturing a flash memory shown in FIG. 24 (a).
Figure 44:
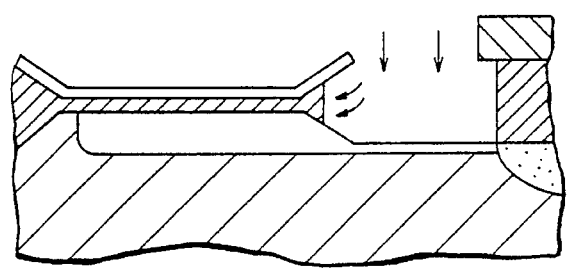
FIG. 44 is a schematic sectional view showing part of a process for manufacturing a flash memory shown in FIG. 24 (a).

At the outset the process until FIG. 6 in Embodiment 1 was repeated. Subsequently, after forming a resist pattern 214, the resist pattern 214 and the silicon nitride film 25 were used as a mask to conduct anisotropic etching to remove part of the device isolation oxide film 29 (see FIG. 43).

Through isotropic etching, the device isolation oxide film 29 below the silicon nitride film 25 was etched in a predetermined amount.

Figure 45:
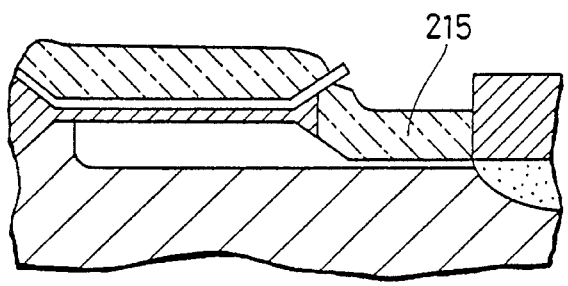
FIG. 45 is a schematic sectional view showing part of a process for manufacturing a flash memory shown in FIG. 24 (a).

Then the SOG (spin on glass) film 215 was coated through an appropriate etch-backing (see FIG. 45).

Figure 46:
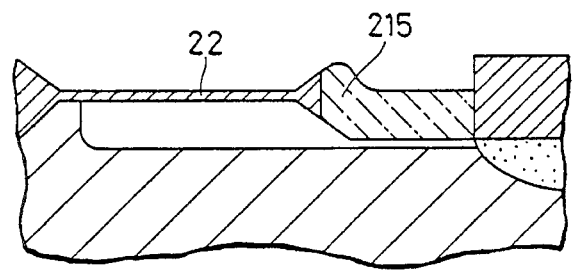
FIG. 46 is a schematic sectional view showing part of a process for manufacturing a flash memory shown in FIG. 24 (a).

Through etch-backing the silicon nitride film 25, the SOG film formed thereon was lifted off (see FIG. 46).

Figure 47:
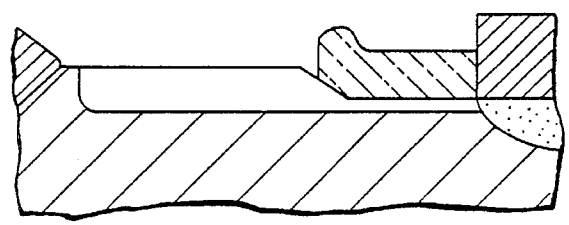
FIG. 47 is a schematic sectional view showing part of a process for manufacturing a flash memory shown in FIG. 24 (a).

The ends of the buffer oxide film 22 and the end of the device isolation oxide film 29 were removed (see FIG. 47).

Figure 48:
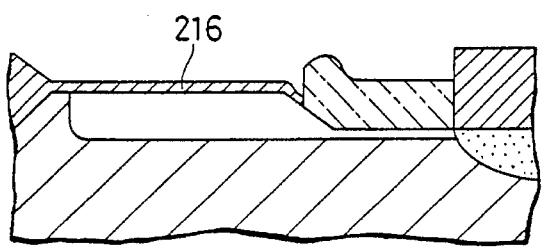
FIG. 48 is a schematic sectional view showing part of a process for manufacturing a flash memory shown in FIG. 24 (a).

The entire surface thereof was thermal oxidized to form gate insulating film 216 (see FIG. 48).

Figure 49:
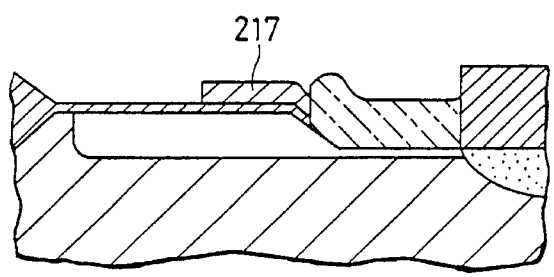
FIG. 49 is a schematic sectional view showing part of a process for manufacturing a flash memory shown in FIG. 24 (a) .

A polysilicon layer was formed on the entire surface thereof and the polysilicon layer was etched by using a resist pattern to form a floating gate electrode 217 (see FIG. 49).

Figure 50:
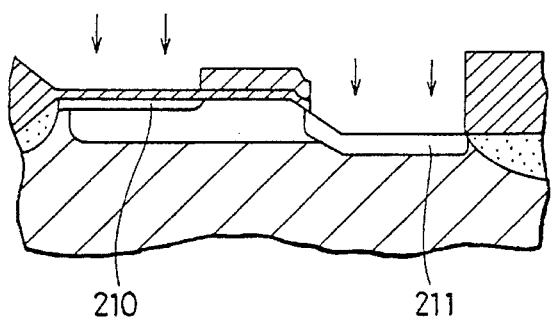
FIG. 50 is a schematic sectional view showing part of a process for manufacturing a flash memory shown in FIG. 24 (a).
Figure 51:
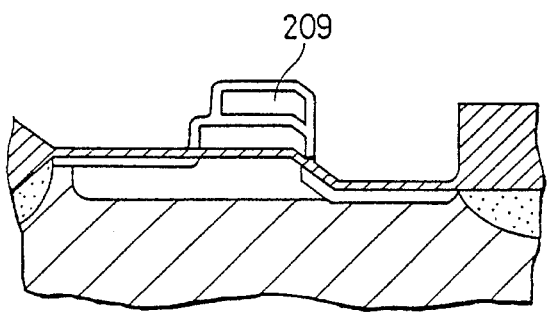
FIG. 51 is a schematic sectional view showing part of a process for manufacturing a flash memory shown in FIG. 24 (a).

The device isolation oxide film 29 and the floating gate electrode 217 were used as a mask to implant a high concentration impurity to form the source region 210 and the drain region 211 (see FIG. 50). At the present time, the source region was formed in a shallow configuration than the drain region 211 so that the source region 210 was formed by implanting impurities through the gate insulating film 216. The surface of the floating gate electrode 217 was oxidized to form the third gate insulating film 208. Subsequently, the polysilicon layer is formed on the entire surface. The resist pattern was used to etch the polysilicon layer thereby forming a control gate electrode 209 through the oxidation process (see FIG. 51).

Figure 52:
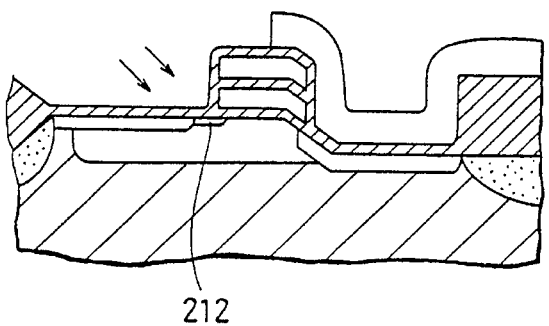
FIG. 52 is a schematic sectional view showing part of a process for manufacturing a flash memory shown in FIG. 24 (a).

The ends of control gate electrode 209 and the end of the floating gate electrode 217 are aligned to each other to oxidize the entire surface thereof. Then, impurities are implanted in the diagonal direction while rotating the substrate to form an LDD region 212 below the floating gate electrode 217 on the side of the source region (see FIG. 52).

Referring to FIGS. 24 (*a*) through (*c*), the direction in which electrons that have been traveling through the channel being accelerated from the source region to the drain region are bent in the configuration of the channel region when the electrons enter into the inclined portion. Consequently, a high electric field is generated as a result of the bent progression direction of the electrons in the substrate (bent in the dislocation composite defect portion resulting from an edge stress at the LOCOS oxidation though it is difficult to describe in an accurate way) and the overlapping of the end portion of the depletion layer of the drain region onto the inclined portion. The high electric field and the bent of the progression direction of electrons promotes the generation of hot electrons. In a cell in which the source region is provided relatively above the drain region, when a (100) silicon substrate is used, the inclined surface (approximate to a (111) surface) of the silicon substrate is used as a material to form a gate oxide film on the side of the drain region. Consequently, the top of the inclined surface on the drain region is formed thicker than the side of the source region in the same thermal oxidation process. This facilitates a countermeasure against an error in erasure at the time of reading data as compared with device in which the drain region is located above the source region. In other words, the process for forming the impurity layer 31 can be omitted which is regarded at the most difficult on the practical level.

An advantage of the device in which the source region shown in FIGS. 24 (*a*) through (*c*) is provided relatively above the drain region will be explained in conjunction with the writing of data onto the hot carrier injection type device. At the outset, positive voltages Vd and Vcg are applied to the drain region and the conjunction with the writing of data onto the hot carrier injection type device. At the outset, positive voltages Vd and Vcg are applied to the drain region and the control gate electrode respectively. At the time, assuming that the substrate and the source region have the same potential and an equation of Vs=0, the current flowing through the channel region Id can be approximated to the following equation.

$$Id = \frac{\mu n \cdot \epsilon ox \cdot W}{2(d1 \cdot l1 + d2 \cdot l2)} (Vf - Vt)^2 \quad (1)$$

Here symbol d1 designates a thickness of a gate insulating film in the planar channel region, d2 a thickness of a gate insulating film in the inclined channel region, $\epsilon$ ox a conductive rate thereof, $\mu n$ a mobility of electrons, l1 effective channel length of the planar channel region, and W a channel width. It is assumed that the conductive rate of the gate insulating film in the planar channel region and that of the gate insulating film in the inclined channel region are the same.

Symbol Vt designates a threshold value with respect to the floating gate electrode, which depends on the effective channel length l.

Symbol Vf designates a potential of the floating gate electrode, which is represented by the following formula;

$$Vf = \frac{Cfc \cdot Vc + Cfd \cdot Vd - Qf}{Cfs + Cfss1 + Cfss2 + Cfd + Cfc} \quad (2)$$

Here, symbol Cfs designates a capacity between the floating gate electrode and the source region. Symbol Cfss1 designates a capacity between the floating gate electrode and the inclined channel region. Symbol Cfss2 designates a capacity between the floating gate electrode and the planar channel region. Symbol Cfd designates a capacity between the floating gate electrode and the drain region, and Cfc a capacity between the floating gate electrode and the control gate electrode. Symbol Qf designates an electric load generated in the floating gate electrode when current flowing through the channel region is accelerated in the electric field between the source and the drain regions and electrons which acquired a sufficient energy is injected into the floating gate electrode. The electric load designated by symbol Qf depends on the rate γ at which hot carrier is injected into the gate insulating film. The time integral of γId at the channel current of Id is given by the following formula:

$$Qf = \int_o^T \gamma Id \, dt$$

At this time, the intensity of the electric field in the gate insulating film is given by the following formula:

$$Eox = \frac{Cfs + Cfss1 + Cfss2 + Cfd}{Cfs + Cfss1 + Cfss2 + Cfd + Cfc} \cdot \frac{Cfc \cdot Vc + Cfd \cdot Vd - Qf}{S1 \cdot \epsilon ox}$$

Thus the time integral of the above can be approximated by the following formula:

$$\frac{dEox}{dt} \approx \frac{\gamma \beta}{\epsilon 1} \left( \frac{\epsilon 1 \cdot Eox}{Cfs + Cfss1 + Cfss2 + Cfd + Cfc} \right)^2$$

In the above formula, $$\epsilon 1 = S1 \cdot \epsilon ox \cdot \frac{Cfs + Cfss1 + Cfss2 + Cfd + Cfc}{Cfs + Cfss1 + Cfss2 + Cfd}$$

Symbol S1 designates a sum of the overlapped area of effective channel length ([Ii+I2]W), the floating gate electrode and the source region. The writing time of the memory transistor Tw can be represented by the function of the following formula by integrating the sum.

$$\frac{(Cfs + Cfss1 + Cfss2 + Cfd + Cfc)^2}{\gamma \beta \epsilon 1}$$

Since Cfss1 and Cfss2 are determined by the thicknesses d1 and d2 and by the adjustment of I1 and I2 to an optimal value by process conditioning, the writing time adjustment can be facilitated than the conventional structure with the adjustment of this value. As described above, a bent is generated in the channel current with the result that the implantation efficiency can be improved at that portion.

Example 10

Figure 25:
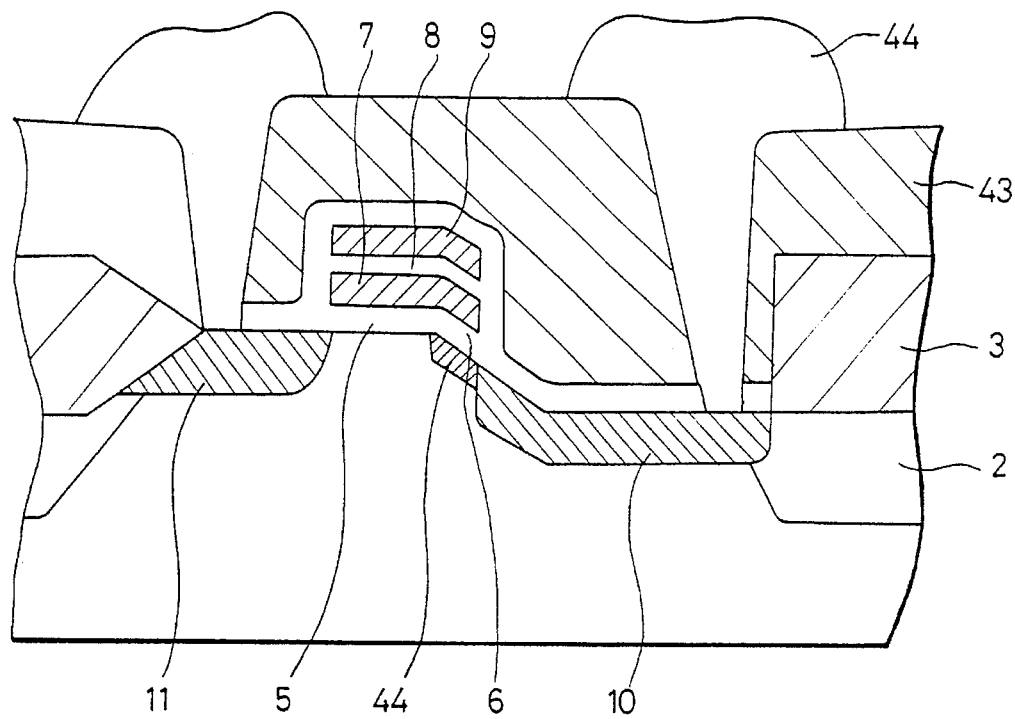
FIG. 25 is a schematic sectional view of a flash memory of the present intention.

In the above examples, the rotation ion implantation method was used to secure a overlap amount with the floating gate electrode in the formation of a low concentration region in the source region. However, as shown in FIG. 25, the approximately entire region of the inclined region could be a low concentration source region.

The above method will be described in detail hereinafter.

Figure 26:
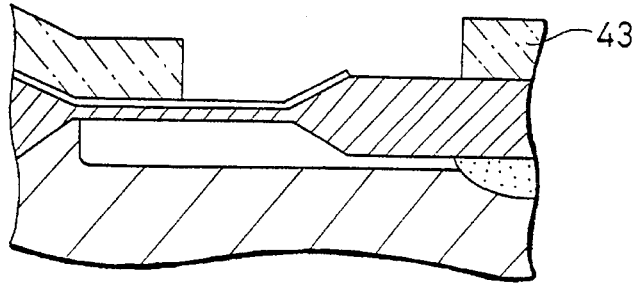
FIG. 26 is a schematic sectional view showing part of the process for manufacturing the flash memory shown in FIG. 25.
Figure 27:
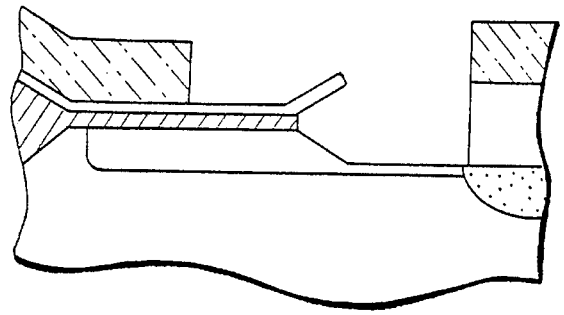
FIG. 27 is a schematic sectional view showing part of the process for manufacturing the flash memory shown in FIG. 25.
Figure 28:
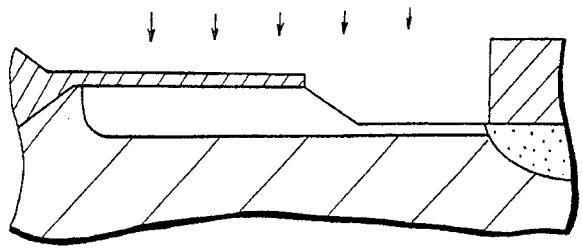
FIG. 28 is a schematic sectional view showing part of the process for manufacturing the flash memory shown in FIG. 25.
Figure 29:
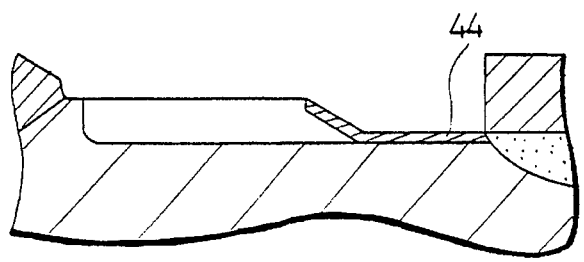
FIG. 29 is a schematic sectional view showing part of the process for manufacturing the flash memory shown in FIG. 25.
Figure 30:
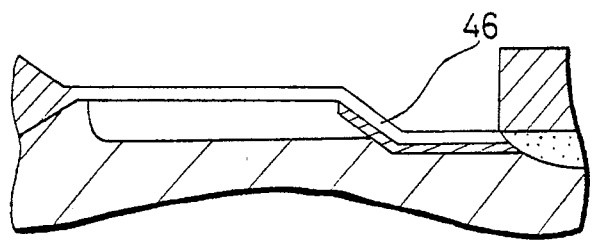
FIG. 30 is a schematic sectional view showing part of the process for manufacturing the flash memory shown in FIG. 25.

At the outset, in the same method as the example 1, all the parts were formed in the same manner up to the device isolation oxide film 29 of FIG. 6. Then, as shown in FIG. 26, a resist pattern 43 was formed which had an opening at least on part of the active region and on the device isolation region where the source region was formed with the silicon nitride pattern 25 left as it was. The resist pattern 43 and the silicon nitride film 25 are used as a mask to remove part of the device isolation oxide film 29 by wet etching with a clean HF solution of (see FIG. 27). Later, the resist pattern 43 was peeled off and the silicon nitride film pattern 25 was removed which was followed by implanting As ions at 10 KeV in a low concentration for the formation of the low concentration source region. (see FIG. 28). This formed a low concentration source region 44 on in the inclined region (see FIG. 29). Since a buffer oxide film 22 was present which had a thickness of about 1000 Å on the channel and the drain formation region, the ion implantation could be prevented.

Figure 31:
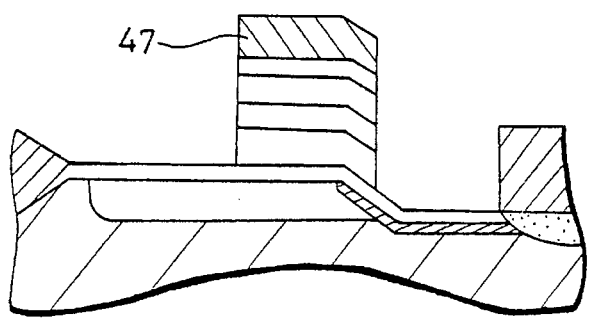
FIG. 31 is a schematic sectional view showing part of the process for manufacturing the flash memory shown in FIG.
Figure 32:
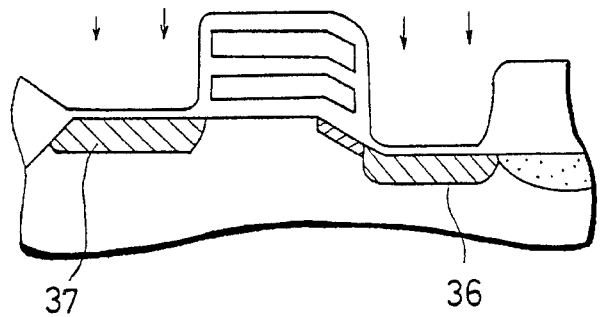
FIG. 32 is a schematic sectional view showing part of the process for manufacturing the flash memory shown in FIG. 25.

At subsequent steps, the buffer oxide film 22 was etched with the clean HF solution, followed by thermal oxidation to form a gate insulating film 46 on the exposed surface of the substrate 1. Then, by CVD, a polysilicon film, an oxide film, a polysilicon film, an oxide film and a resist pattern 47 was formed in this order (see FIG. 31). After the resist pattern 47 was used as a mask to form a control gate electrode and a floating gate electrode, the resist pattern 47 was removed. After oxidation step, the device isolation film, the control gate electrode and the floating gate electrode were used as a mask to implant a high concentration of As ions thereby forming the source region 36 and the drain region 37 (see FIG. 32). This step allowed an easy secure of an overlap amount of the floating gate electrode and the source region. Incidentally, a height difference between the upper surfaces of the source region 36 and the drain region 37 is preferably 5 µm or less. The bird's beak length is preferably 0.6 to 0.8 µm.

Subsequently, the writing and erasing operations of the above device will be explained.

At the outset, data could be written into the memory by grounding the source region and then applying a voltage to the drain region and the control gate electrode. The applied voltage is shown in the following table.

| source region | 0 V | 0 V |
| control gate electrode | 10 V | 12 V |
| drain region | 4 V | 6 V |

Under the above condition electrons flows from the source region 10 to the drain region 11. In the neighborhood of the drain region 11, electrons were generated which could go over a energy barrier formed from the silicon surface to the oxide film. These electrons were implanted into the floating gate electrode 7 which enabled writing data into the memory.

Figure 33:
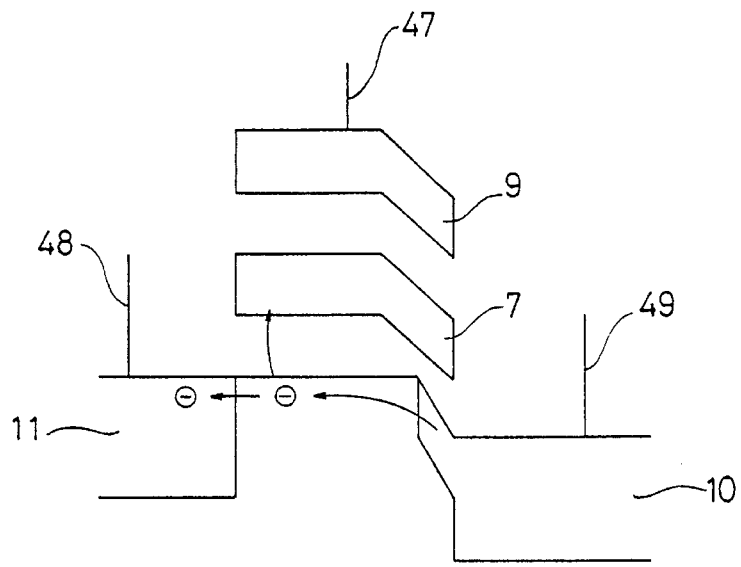
FIG. 33 is a model view showing a flow of electrons during writing of the flash memory of the present invention.

FIG. 33 is a model view showing the above writing operation. Referring to FIG. 33, reference numeral 47 designates a row address line whereas 48 a column address line, and 49 a erasing line.

Furthermore, data could be erased by the conventional method.

A concrete example thereof is shown hereinafter.

| source region | 10 V | 13 V |
| --- | --- | --- |
| control gate electrode | 0 V | 0 V |
| drain region | open | open |

Figure 34:
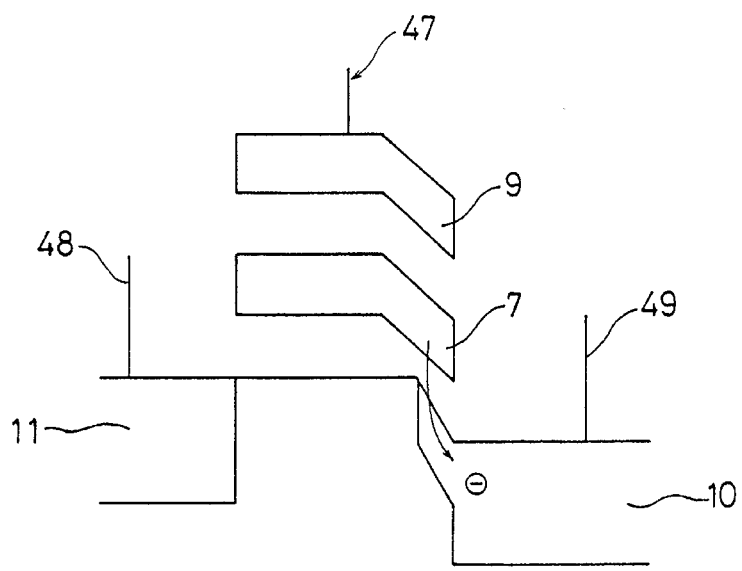
FIG. 34 is a model view showing a flow of electrons during the erasing of the flash memory of the present invention.

Under the above conditions, an electric field is discharged from the floating gate electrode to the source region (Fowler-Nordheim tunnel effect). FIG. 34 is a model view showing the above operation.

Example 11

In the above examples, self-aligned cells were used to give a concrete explanation for simplicity. However, in accordance with the present invention, hot electrons at the pinch-off point progressed toward the floating gate electrode with a definite angle. Thus as shown in FIG. 35, an offset type flash memory exhibits more conspicuous advantages than self-aligned type.

Figure 35:
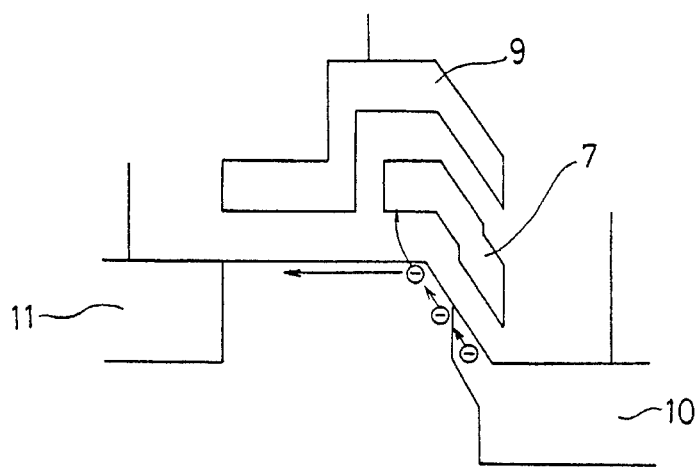
FIG. 35 is a model view showing a flow of electrons during the writing of the offset type flash memory of the present invention.

Incidentally, referring to FIG. 35, symbol—designates a hot electron in which arrows indicate that hot electrons at the pinch-off point progressed toward the floating gate electrode with a definite angle.

Example 12

Figure 36:
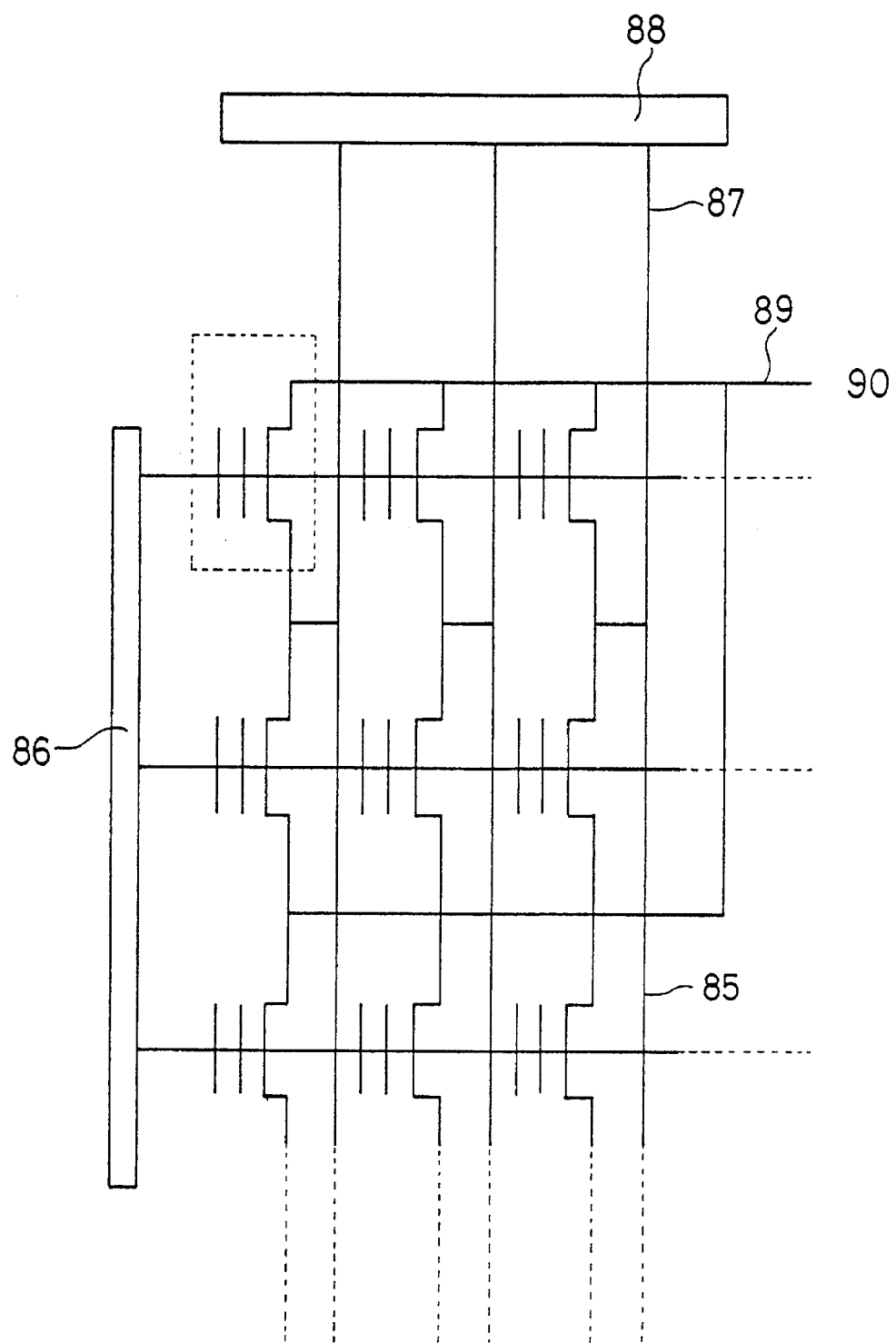
FIG. 36 is a wiring diagram in which the flash memory of the present invention is arranged in matrix configuration.

As shown in FIG. 36, the flash memory of the present invention could be arranged in matrix. Incidentally, FIG. 36 shows a memory cell array of NOR type. Referring to FIG. 36, reference numeral 84 designates a memory site where the flash memory of the present invention was arranged, 85 a row address line, and a signal line wired from a row address decoder 86. Reference numeral 87 designates a column address line, and a signal line wired from a column address decoder 88. Reference numeral 89 designates an erasing line, and a signal line wired from a source decoder 90.

In accordance with the present invention, either of the source region or the drain region is positioned below the rest thereof which enables substantially extending the length of the channel region. Therefore the present invention has an advantage that a punch-through hardly occurs as compared with the same two-dimension design rule.

Furthermore, the present invention allows realization of a flash memory which has a small area, a rapid writing and erasing speed, and erroneous erasure of data can be prevented in reading operation. Since such flash memory is excellent in large amount production and miniaturization, and has an extremely excellent endurance against frequent writing, erasing and reading operation, the flash memory has an insurmountable industrial value as an image processing memory used for frequently executing simple operations of a large amount of data or as a device which can substitute a magnetic memory.

Figure 53:
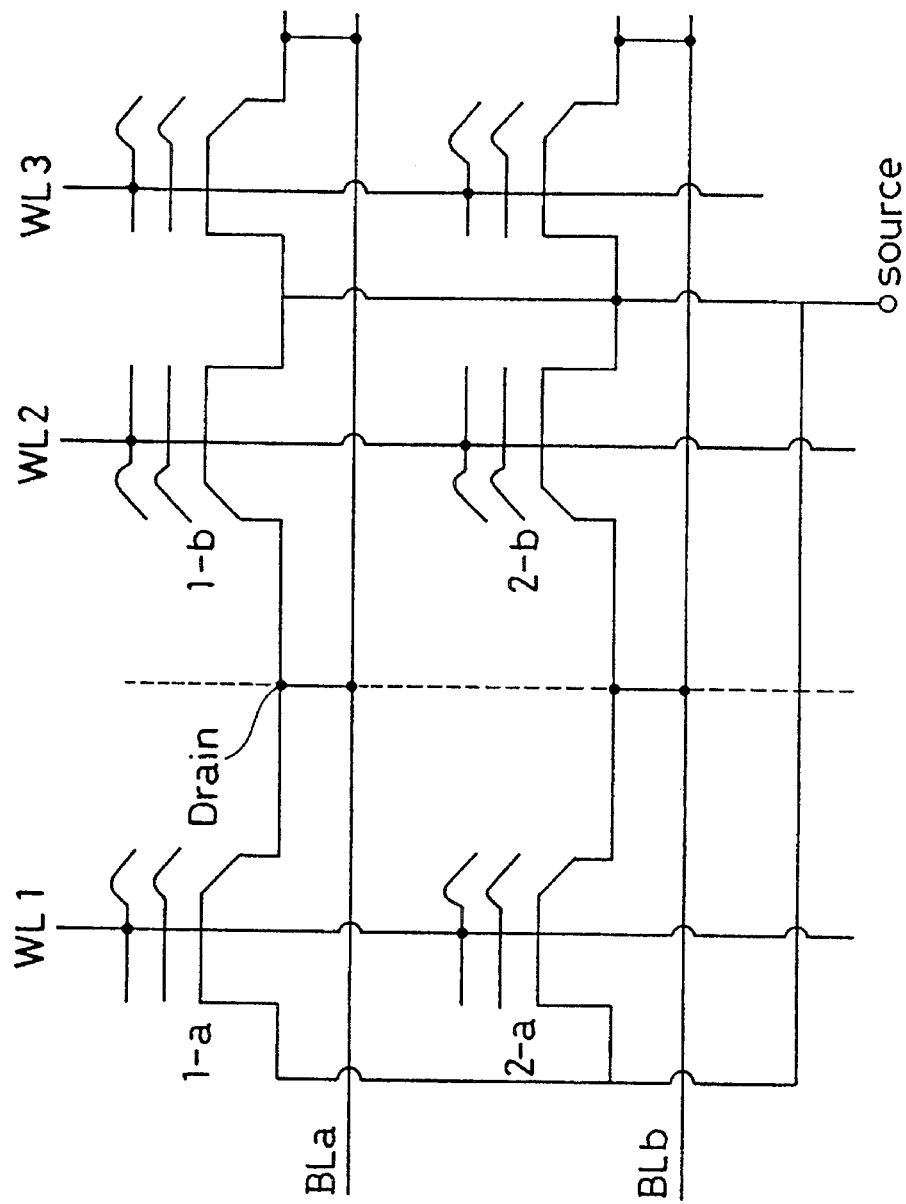
FIG. 53 is a wiring diagram in which the flash memory of the present invention is arranged in matrix configuration.

Referring to FIG. 53, the present invention will be further illustrated.

At the outset, when the threshold value of cell 1-a which has been programmed at the time of writing operation is 5 V (which means that the threshold value of the cell has risen from 1 V to 5 V by the implantation of the impact ionized hot electrons into the floating gate electrode), 0 V (nonselective) is applied to the word line WL1 and 12 V (selective) is applied to the word line WL2 for writing data, and 6 V is applied to BLa.

Consequently, between the drain region and the floating gate electrode in the cell 1-a, the sum of 6 V applied to the BLa and a voltage having an electric load that can raise 1 V of an accumulated threshed voltage to 5 V is then applied (for example, 6+4 V). This means that a voltage approximating to 10 V (somewhat reduced in actuality due to the relation between each capacity) is applied between the drain region and the floating gate electrode when the cell 1-a in which data has been written serves for writing data into the cell 1-b.

In the flash memory of the present invention in which the drain regions serve as bit lines provides cells which receives a voltage approximate to 10 V between the drain region and the floating gate electrode at a frequency corresponding to the number of cells connected to the bit lines.

On the other hand, each of these cells receives 13 V when data is erased from the memory thereby eliminating the electric load.

It is hard to say that there is a large difference between the voltage applied between the drain region and the floating gate electrode at the time of writing data into the cell 1-a and the voltage applied between the source region and the floating gate at the time of erasing data.

This generates a problem in that data in the cell is erased wen data is written into different cells commonly connected at the drain region. However, in accordance with the present invention data is erased through Fowler-Nordheim tunneling, the tunnel distance (thickness of the gate insulating film) can be extended when the barrier height (difference in voltage) cannot be enlarged.

In other words, to facilitate an erasure in erasing operation and prevent an erred erasure in writing operation, cells can be formed having a thick gate insulating film on the drain side and a thin source side to be bilaterally arranged and connected centering on the drain region thereby forming a memory cell matrix.

What is claimed is:

1. A electrically erasable and programmable memory comprising:

a semiconductor substrate;

a source region and a drain region formed spaced apart from each other by a definite distance on a main surface of said semiconductor substrate;

a channel region provided between the source region and the drain region;

a gate insulating film provided on the channel region;

a floating gate electrode provided on the gate insulating film; and a control gate electrode provided with an interlayer insulating film sandwiched therebetween so that the control gate electrode at least partially laminates the floating gate electrode;

the main surface having an inclined portion, and the channel region being formed in a region comprising at least a point of change in an inclination angle of the inclined portion, and the source region being vertically offset with respect to the drain region.

2. A memory according to claim 1 wherein an inclined portion is provided by removing an oxide film formed on the channel region by the local oxidation method.

3. A memory according to claim 1 wherein the source region has a higher dielectric than the drain region.

4. A memory according to claim 1 wherein the gate insulating film has a thickness thinner than the rest of the film in the source region and in the neighborhood thereof.

5. A memory according to claim 1 wherein the gate insulating film is thinly formed in a restricted region, and a thinly formed region is formed at the inclined portion of the channel region.

6. A memory according to claim 1 wherein the floating gate electrode has an upper surface area larger than a lower surface area on the side of the drain region.

7. A memory according to claim 1 wherein the floating gate electrode extends over the drain region with an insulating film sandwiched therebetween.

8. A memory according to claim 7 wherein the drain region has a non-planar upper surface.

9. A memory according to claim 1 wherein the device is isolated by the presence of a bias to a device isolation gate electrode.

10. A memory according to claim 9 wherein the device isolation gate electrode has a control gate electrode and a floating gate electrode in the gate oxide film below the control gate electrode.

11. A memory according to claim 1 wherein the channel region in the neighborhood of the drain region has a higher impurity concentration than the channel region in the neighborhood of the source region.

12. A memory according to claim 1 wherein the flash memory is formed in the well on the surface of the substrate, the well having the same conductive type as the substrate or the conductive type opposite thereto.

13. A memory according to claim 1 wherein at least one of the source region or the drain region is located partially on the inclined surface.

14. A memory according to claim 1 wherein a plurality of memories are arranged, two memories adjacent to each other shares the drain region of the other and the memory has a mirror symmetry relation based on the drain region.

15. A memory according to claim 8 wherein the non-planar upper surface has a trench formed therein.

16. A memory according to claim 15 wherein the floating gate electrode at least partially extends into the trench.

17. A memory according to claim 1, wherein the floating gate electrode is provided over the point of change in the inclination angle of the inclined portion of the main surface.

* * * * *